United States Patent [19]

Kida et al.

[11] Patent Number: 5,258,641
[45] Date of Patent: Nov. 2, 1993

[54] SEMICONDUCTOR DEVICE FOR EXTRACTING A SIGNAL USED TO MONITOR POTENTIAL OF A HIGH VOLTAGE ISLAND AT A LOW VOLTAGE ISLAND AND METHOD OF MANUFACTURING THE SAME

[75] Inventors: Takeshi Kida; Kazumasa Satsuma, both of Itami; Gourab Majumdar, Fukuoka; Tomohide Terashima, Fukoaka; Hiroshi Yamaguchi, Fukuoka; Masanori Fukunaga, Fukuoka; Masao Yoshizawa, Itami, all of Japan

[73] Assignee: Mitsubishi Denki Kabushiki Kaisha, Tokyo, Japan

[21] Appl. No.: 944,074

[22] Filed: Sep. 11, 1992

Related U.S. Application Data

[63] Continuation of Ser. No. 547,243, Jul. 3, 1990, Pat. No. 5,200,638.

[30] Foreign Application Priority Data

Dec. 28, 1989 [JP] Japan ................... 1-340202

[51] Int. Cl.$^5$ ........................... H01L 29/68
[52] U.S. Cl. ..................... 257/490; 257/138; 257/141; 257/343; 257/355; 257/546
[58] Field of Search ............ 257/339, 355, 367, 490, 257/495, 500, 546, 138, 141, 343

[56] References Cited

U.S. PATENT DOCUMENTS

| | | | |
|---|---|---|---|
| 3,463,977 | 8/1969 | Grove et al. | 357/53 |
| 4,567,502 | 1/1986 | Nakagawa et al. | 357/53 |
| 4,713,681 | 12/1987 | Beasom | 357/53 |
| 4,721,986 | 1/1988 | Kinzer | 357/23.4 |
| 4,922,327 | 5/1990 | Mena et al. | 357/23.4 |
| 4,933,740 | 6/1990 | Baliga et al. | 357/23.4 |
| 4,942,440 | 7/1990 | Baliga et al. | 357/43 |
| 4,943,835 | 7/1990 | Yakushiji et al. | 257/495 |
| 4,963,951 | 10/1990 | Adler et al. | 357/43 |
| 4,992,844 | 2/1991 | Yakushiji | 357/43 |
| 5,200,638 | 4/1993 | Kida et al. | 257/355 |
| 5,204,545 | 4/1993 | Terashima | 257/490 |

FOREIGN PATENT DOCUMENTS

| | | |
|---|---|---|
| 0343977 | 11/1989 | European Pat. Off. . |
| 2823629 | 12/1978 | Fed. Rep. of Germany ........ 357/53 |
| 60-246674 | 12/1985 | Japan . |

OTHER PUBLICATIONS

Wildi et al., "500v BIMOS Technology and Its Applications," IEEE, 1985, pp. 37-41.
Akio Nakagawa et al., "High Voltage Low On-Resistance VDMOS FET", Japanese Journal of Applied Physics Suppl. vol. 21, 1982, pp. 97-101.
H. W. Becke, "Approaches to Isolation in High Voltage Integrated Circuits", Internat'l Electron Devices Meeting, Washington, D.C., Dec. 1-4, 1985, pp. 724-727.

Primary Examiner—Andrew J. James
Assistant Examiner—Courtney A. Bowers
Attorney, Agent, or Firm—Oblon, Spivak, McClelland, Maier & Neustadt

[57] ABSTRACT

On the p$^-$ substrate, the n$^-$ epitaxial layer is surrounded and isolated by the p well. In the surface of the n$^-$ epitaxial layer, there is provided the p floating region in the vicinity of the p well, on which the sense electrode is provided. The insulation film and the conductive film are formed on the n$^-$ epitaxial layer between the p well and the p floating region to overlap them. The conductive film and the p floating region serve as a composite field plate, which makes it hard that the surface electric field distribution is influenced by the state of electric charge in the surface and relieves the surface electric field by expanding the depletion layer, which extends from the pn junction between the n$^-$ epitaxial layer and the p well into the n$^-$ epitaxial layer in current blocking state, toward the center of the n$^-$ epitaxial layer. The potential of the p floating region is determined by capacity coupling in the current blocking state and thus the sense voltage characteristics through the sense electrode can be smooth.

6 Claims, 21 Drawing Sheets

FIG. 3.1
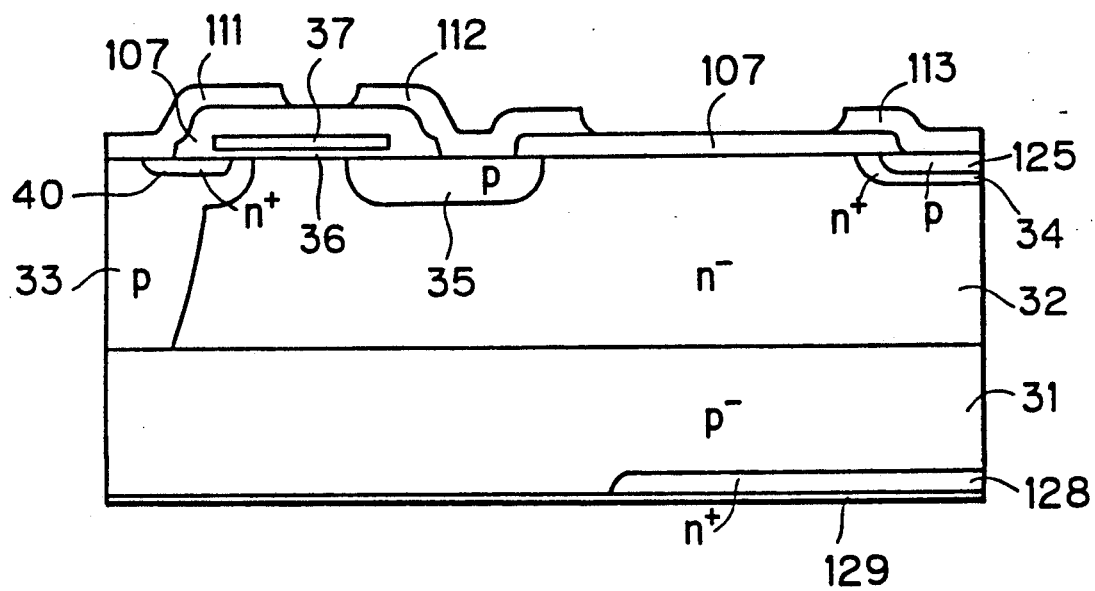
FIG. 32
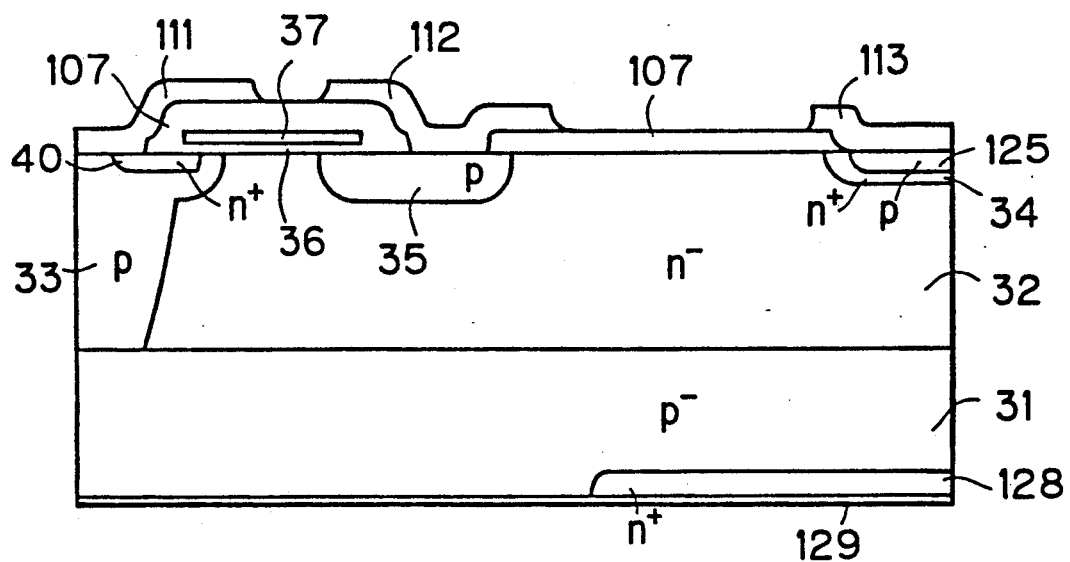

SEMICONDUCTOR DEVICE FOR EXTRACTING A SIGNAL USED TO MONITOR POTENTIAL OF A HIGH VOLTAGE ISLAND AT A LOW VOLTAGE ISLAND AND METHOD OF MANUFACTURING THE SAME

This is a continuation of application Ser. No. 07/547,243, filed on Jul. 3, 1990, U.S. Pat. No. 5,200,638.

BACKGROUND OF THE INVENTION

1. Field of the Invention

The present invention relates to a semiconductor device and a method of manufacturing the same and, more particularly, it relates to a semiconductor device which has islands of high voltage and low voltage formed on a single chip and is suitable for effectively enhancing breakdown voltage of the island of high voltage and for extracting a signal used to monitor the potential of the island of high voltage at the island of low voltage, and to a method of manufacturing the same.

2. Description of the Background Art

FIG. 1 is a circuit diagram showing a single phase of a half bridge circuit for driving a load such as a motor. In this figure, insulating gate bipolar transistors (referred to as "IGBT" hereinafter) 1 and 2 are connected in a totem pole manner between a high voltage power source $+V$ and ground. Flywheel diodes 3 and 4 are connected in parallel to the IGBTs 1 and 2, respectively. A control circuit is formed on a semiconductor chip 5 to control turning ON/OFF the IGBTs 1 and 2. This control circuit consists of a control logic 6, drive circuits 7 and 8 for producing gate drive signals of the IGBTs 1 and 2 in response to a signal from the control logic 6, and a high breakdown voltage switching element 9 for shifting the level of the signal from the control logic 6 to apply it to the drive circuit 7 on the side of high voltage. The high breakdown voltage switching element 9 is switched into a predetermined manner in response to the signal from the control logic 6 and thereby applies a command from the control logic 6 to the drive circuit 7 on the side of high voltage.

The semiconductor chip 5 includes a low voltage region including the control logic 6 and the drive circuit 8, and a high voltage region including the drive circuit 7 and the high breakdown voltage switching element 9. Conventionally, when the high and low voltage regions are formed on a single chip by means of diffusion isolation, utilizing the diffusion from the surface up to the substrate, regions (islands) 9a and 9b to be isolated are enclosed by a diffusion region 10 of a contrary conductivity type, as shown in FIG. 2. For example, the island 9a may be an island of high voltage, and the island 9b may be an island of low voltage. As it is impractical to perform the diffusion excessuvely deep, the thickness of an epitaxial layer 11 is restricted to be relatively thin, and the high breakdown voltage element must be formed on such a thin island 9a.

U.S. Pat. No. 4,292,642 discloses the technique. FIG. 3 is a sectional view showing a high breakdown voltage diode disclosed in the USP in which a thin epitaxial layer is employed. A thin $n^-$ epitaxial layer 13 is formed on a $p^-$ substrate 12, and a $p^+$ diffusion region 14 extending from the surface of the $n^-$ epitaxial layer 13 up to the $p^-$ substrate 12 is provided. On the surface of the $n^-$ epitaxial layer 13, an $n^+$ diffusion region 15 is provided. An axis R is the center of the rotation, and thus the diode is so structured that the $p^+$ diffusion region 14 surrounds the $n^-$ epitaxial layer 13 and the $n^+$ diffusion region 15 to isolate them.

A broken line in the figure shows extension of a depletion layer from the pn junction in case of applying high voltage $+V$ between the $p^+$ diffusion region 14 and the $n^+$ diffusion region 15. A graph in the upper portion of the figure shows the intensity of an electric field in the surface, while a graph in the right portion shows the intensity of an electric field corresponding to the depth. Now, the junction between the substrate 12 and the epitaxial layer 13 is named a first pn junction $J_1$, and the junction between the diffusion region 14 and the epitaxial layer 13 is named a second pn junction $J_2$. Since the first pn junction $J_1$ is a junction between $p^-$ and $n^-$ regions, a depletion layer extends from the junction to both sides, while since the second pn junction $J_2$ is a junction between $p^+$ and $n^-$ regions, a depletion layer extends from the junction merely to one side (to the $n^-$ region). In one-dimensional system, that is, assuming that the first and second pn junctions $J_1$ and $J_2$ are infinite plane junctions, the second pn junction $J_2$ yields only one-second of the breakdown voltage that the first pn junction $J_1$ does. Thus, the breakdown voltage of the diode is determined based upon that of the second pn junction $J_2$. However, when the thickness d of the epitaxial layer 13 is small, the extention of the depletion layer from the first pn junction $J_1$ changes a form of the depletion layer extending from the second pn junction $J_2$, and as a result, the depletion layer extends more in the lateral direction (the right direction in the figure) in the surface of the epitaxial layer 13. Consequently, the surface electric field is relieved.

Satisfying the following formula, $$2.6 \times 10^2 \epsilon E \sqrt{V_B/L} \leq 5.1 \times 10^5 \epsilon E \tag{1}$$

the surface electric field is relieved to the same level as the first pn junction $J_1$ or below, and the breakdown voltage of the diode rises to approximate to the one-dimensional breakdown voltage of the first pn junctin $J_1$. Herein, N denotes an impurity concentration of the $n^-$ epitaxial layer 13, $\delta$ denotes a dielectric constant of the semiconductor matrial, E is a critical electric field, $V_B$ denotes a breakdown voltage, and L denotes a distance between the $p^+$ diffusion region 14 and the $n^+$ diffusion region 15.

The switching element 9 shown in FIG. 1 must have high breakdown voltage. The control logic 6 of the island of low voltage must monitor the potential of the island of high voltage for the protecting operation, as shown by a broken line in the figure. If the high potential of the island of high voltage is inputted as it is to an element of low breakdown voltage in the island of low voltage, the element might be broken, and hence sensing must be done in some indirect way.

This technique is disclosed in "Proceedings of the 1985 International Electron Device Meeting, pp. 37-41, 500V BIMOS TECHNOLOGY AND ITS APPLICATIONS, Eric J. Wildi et alii". FIG. 4 is a sectional view showing a high breakdown voltage npn transistor having a sense terminal which is disclosed in this thesis. The npn transistor has a structure basically the same as that shown in FIG. 3, and additionally has an $n^+$ buried region 16 formed in the interface between the $p^-$ substrate 12 and the n⁻ epitaxial layer 13, an n⁺ diffusion region 17 extending from the surface of the n⁻ epitaxial layer 13 up to the n⁺ buried region 16, a p diffusion region 18 formed in the surface of the n⁻ epitaxial layer 13, and an n⁺ diffusion region 19 formed in the surface of the p diffusion region 18. Symbols C, E, B and SEN denote a collector, an emitter, a base and a sense terminal, respectively.

When an applied voltage of a collector terminal C rises, depletion layers in an area $X_j$ extend from the upper and lower side, and hence it works as a JFET. When the area $X_j$ is completely filled with the depletion layer, the potential of the n⁺ buried layer 16 and the n⁺ diffusion region 17 on the left from the area $X_j$ is separated from the potential of a region on the right of the $X_j$, and since then, the rising amount of the potential of the collector terminal C is absorbed because of the depletion of the region on the right of the area $X_j$.

An equivalent circuit to the structure in FIG. 4 is shown in FIG. 5. That is, a cascade connection between an npn transistor 20 and a JFET 21 makes a high breakdown voltage npn transistor with a sense terminal. Since the voltage at the sense terminal SEN is expressed by a curve shown in FIG. 6, it is possible to keep the sense voltage low by optimizing the design of the JFET 21. Monitering the sense voltage allows the potential of the region of high voltage (the region on the right of the area $X_j$) to be sensed indirectly. The sense voltage characteristic can be regulated by altering the length of the area $X_j$. The region on the right of the area $X_j$, which is a high voltage keeping region, must be optimized by the technique of the high breakdown voltage diode shown in FIG. 3.

With the structure shown in FIG. 3, it is necessary to satisfy the condition of the formula (1) so as to optimize the breakdown voltage. Especially the requirement of the right half of the formula (1)

$$Nd \leq 5.1 \times 10^5 \epsilon E \qquad (2)$$

requires that the extension of the depletion layer from the first pn junction $J_1$ sufficiently reaches the surface just before breakdown. Under the optimized condition, the surface electric field takes two peaks with almost the same intensity. Such a surface electric field distribution is unstable depending upon the state of electric charge on the surface, and there arises a problem about the reliability in breakdown voltage.

In addition to that, due to the restriction of the formula (2), the impurity concentration N and the thickness d of the n⁻ epitaxial layer 13 can not be made so large, and thus the freedom in design is insufficient. As a result, there arises the problems that on state resistance is increased because the impurity concentration of the n⁻ epitaxial layer 13 can not be made higher and that the breakdown voltage is reduced and leakage current is increased in other islands of low voltage because the thickness d of the n⁻ epitaxial layer 13 can not be made larger.

On the other hand, with the structure shown in FIG. 4, the sense voltage characteristic is controlled by the length of the area $X_j$. The length of the area $X_j$ corresponds to the channel length of the JFET, and an element belonging to a class of the breakdown voltage of 500 V requires having a length of 20 μm at the lowest. There is the problem that a large area is required for the structure for sensing, allowing for the existence of the p⁺ diffusion region 14 and the n⁺ diffusion region 17.

Since the p diffusion region 18 is a base region of a transistor, its size can not be changed as desired. Accordingly, it is necessary to provide the n⁺ buried region 16 to regulate the length of the area $X_j$. It is difficult to form the n⁺ buried region 16 and the p diffusion region 18 with the relative position between them kept accurately, and as a result, there arises the problem that the length of the area $X_j$ and accordingly the sense voltage characteristic varies widely.

Further, since the sense voltage characteristic is that the sense voltage rapidly rises until the channel of the JFET is closed and thereafter hardly rises, as shown in FIG. 6, there arises the problem that the voltage change under the condition that the channel of the JFET is closed can not be easily sensed.

SUMMARY OF THE INVENTION

A semiconductor device according to the present invention comprises a first conductivity type semiconductor substrate, a second conductivity type first semiconductor region formed on the semiconductor substrate in an island manner, a first conductivity type second semiconductor region formed on the semiconductor substrate to surround the first semiconductor region, a first conductivity type third semiconductor region selectively formed in a surface of the first semiconductor region in a vicinity of the second semiconductor region, a voltage applying region formed in the surface of the first semiconductor region near a center thereof, an insulating film formed on the surface of the first semiconductor region between the second and third semiconductor regions to overlap with surfaces of the second and third semiconductor regions, a conductive film formed on the insulating film, and a sense electrode formed on the third semiconductor region for use in detecting a voltage applied to the voltage applying region in a current blocking state.

A method of manufacturing a semiconductor device according to the present invention comprises the steps of preparing a first conductivity type semiconductor substrate, forming a second conductivity type semiconductor layer on the semiconductor substrate, selectively introducing a first conductivity type impurity into the semiconductor layer to provide second conductivity type first semiconductor region formed on the semiconductor substrate in an island manner and a first conductivity type second semiconductor region formed on the semiconductor substrate to surround the first semiconductor region, forming an insulating film and a conductive film in this order on an end portion adjacent to the second semiconductor region of the first semiconductor region, selectively forming a first conductivity type third semiconductor region in a surface of the first semiconductor region in a vicinity of the second semiconductor region by self-matching using the conductive film as a mask, forming a voltage applying region in the surface of the first semiconductor region near a center thereof, and forming a sense electrode on the third semiconductor region for use in detecting a voltage applied to the voltage applying region in a current blocking state.

According to the present invention, a conductive film and a third semiconductor region serve as a composite field plate so as to make it hard that the surface electric field distribution is influenced by the state of electric charge in the surface and to relieve the surface electric field by expanding the depletion layer, which extends from the pn junction between the first and second semiconductor regions into the first semiconductor region in current blocking state, toward the voltage applying region in the surface of the first semiconductor region. In the current blocking state, the potential of the floating third semiconductor region is determined by capacity coupling, and because of this, smooth sense voltage characteristic through a sense electrode is obtained.

According to the manufacturing method of the present invention, since the third semiconductor region is formed by self-matching using a conductive film as a mask, the length by which both of them overlap can be precisely controlled. Since most of the capacity coupling which determines the potential of the third semiconductor region depends upon the overlapping length, the sense voltage characteristics can be accurately controlled.

Accordingly, it is an object of the present invention to provide a semiconductor device having a compact sense structure which has high reliability in breakdown voltage because of the stability of the surface electric field distribution, further has enhanced freedom of design because of wide ranges of the usable thickness of a layer and the usable impurity concentration of the layer, and additionally has a sense voltage characteristic which varies very little and can be easily sensed, and to provide a method of manufacturing such a semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 21 to FIG. 38 are sectional views showing still another embodiment of the semiconductor device according to the present invention.

DETAILED DESCRIPTION OF THE PREFERRED EMBODIMENT

Figure 7:
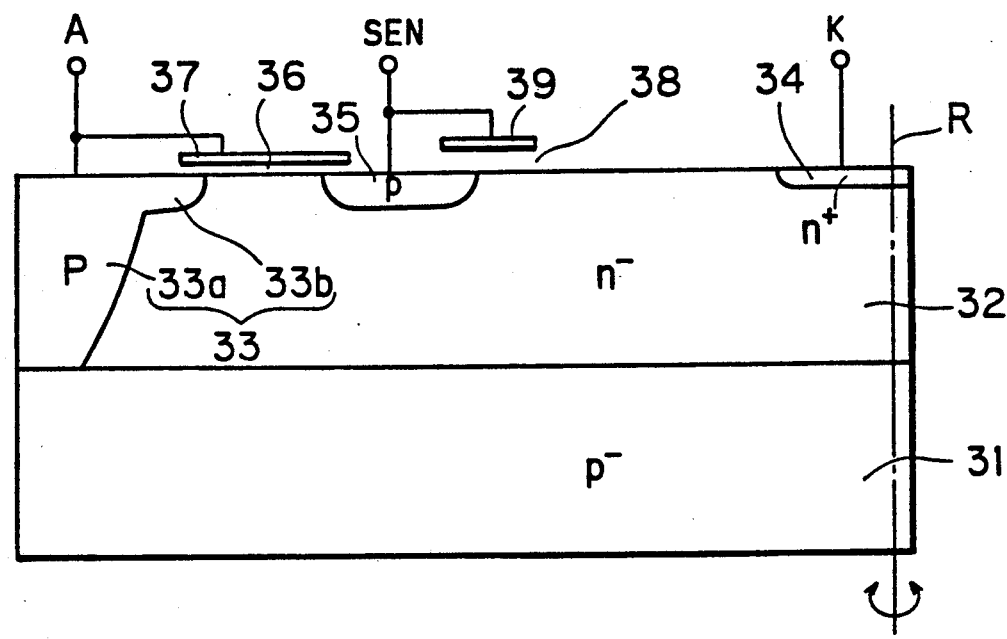
FIGS. 7 and 10 are sectional views showing a high breakdown voltage diode with a sense terminal which is an embodiment of a semiconductor device according to the present invention.

FIG. 7 is a sectional view showing a high breakdown voltage diode with a sense terminal which is an embodiment of a semiconductor device according to the present invention. In FIG. 7, an $n^-$ epitaxial layer 32 is formed on a $p^-$ semiconductor substrate 31, and a p diffusion region 33 is formed extending from the surface of the $n^-$ epitaxial layer 32 up to the $p^-$ semiconductor substrate 31. The p diffusion region 33 consists of a relatively deep diffusion area 33a and a relatively shallow diffusion area 33b. An $n^+$ diffusion region 34 and a p diffusion region 35 are formed on the surface of the $n^-$ epitaxial layer 32. A conduction film 37 is formed on the surface of the $n^-$ epitaxial layer 32 between the p diffusion regions 33 and 35 through a relatively thin insulating film 36. A conduction film 39 is formed on the end surface of the p diffusion region 35 near the $n^+$ diffusion region 34 through a relatively thick insulating film 38. The conduction film 39 is not essential, and the insulating film 38 may be thin. The p diffusion region 33 and the conduction film 36 are short-circuited and also connected to an anode terminal A. The $n^+$ diffusion region 34 is connected to a cathode terminal K. The p diffusion region 35 and the conduction film 39 are short-circuited and also connected to a sense terminal SEN. An axis R is the center of the rotation as in FIGS. 3 and 4.

Figure 8:
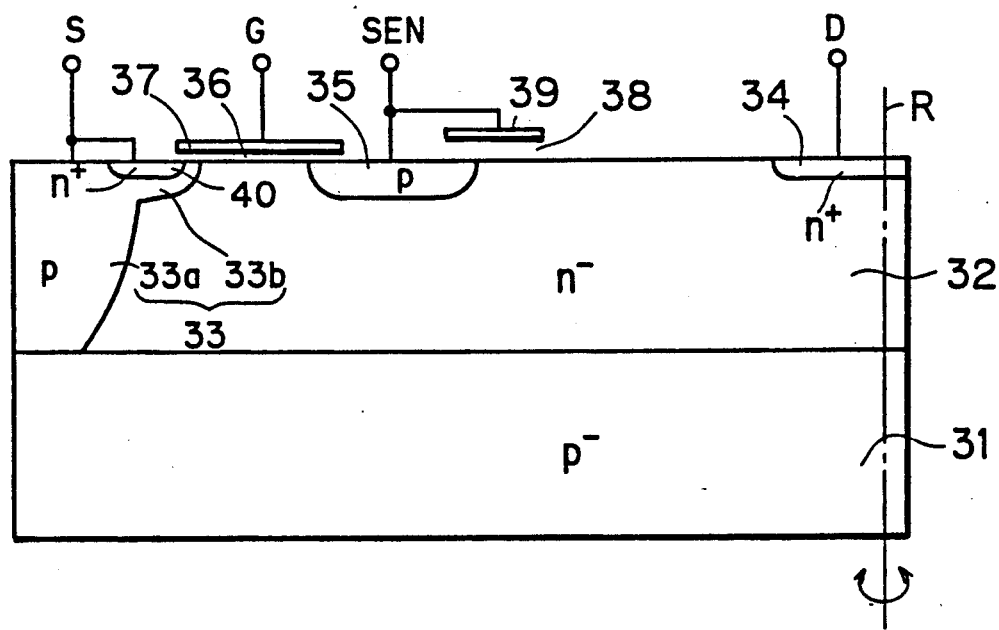
FIG. 8 is a sectional view showing a high breakdown voltage MOSFET with a sense terminal which is another embodiment of the semiconductor device according to the present invention.

FIG. 8 is a sectional view showing a high breakdown voltage MOSFET with a sense terminal which is another embodiment of the semiconductor device according to the present invention. The structure of this MOSFET is the same as that of the diode in FIG. 7 except that an $n^+$ diffusion region 40 is formed on the surface of the shallow diffusion area 33b of the p diffusion region 33, the p diffusion region 33 and the $n^+$ diffusion region 40 are short-circuited and connected to a source terminal S, the conduction film 37 serves as a gate electrode and is connected to a gate terminal G, and the $n^+$ diffusion region 34 is connected to a drain terminal D.

Figure 9A:
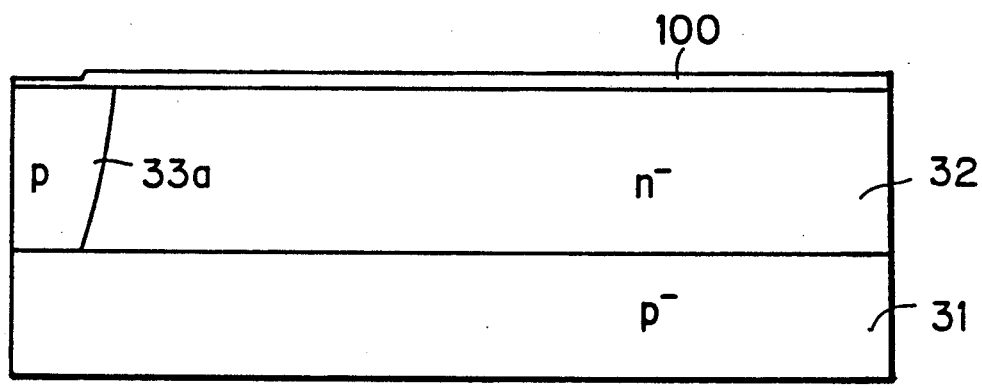
FIGS. 9A to 9E are sectional views showing steps of manufacturing the MOSFET in FIG. 8.

FIGS. 9A to 9E are sectional views showing steps of manufacturing the MOSFET in FIG. 8. First, as shown in FIG. 9A, the $n^-$ epitaxial layer 32 is formed by means of epitaxial growing on the $p^-$ semiconductor substrate 31, and thereafter p-type impurity is selectively diffused in the $n^-$ epitaxial layer 32 through a surface oxidation film 100 to form the p diffusion area 33a extending from the surface of the $n^-$ epitaxial layer 32 up to the $p^-$ semiconductor substrate 31.

Figure 9B:
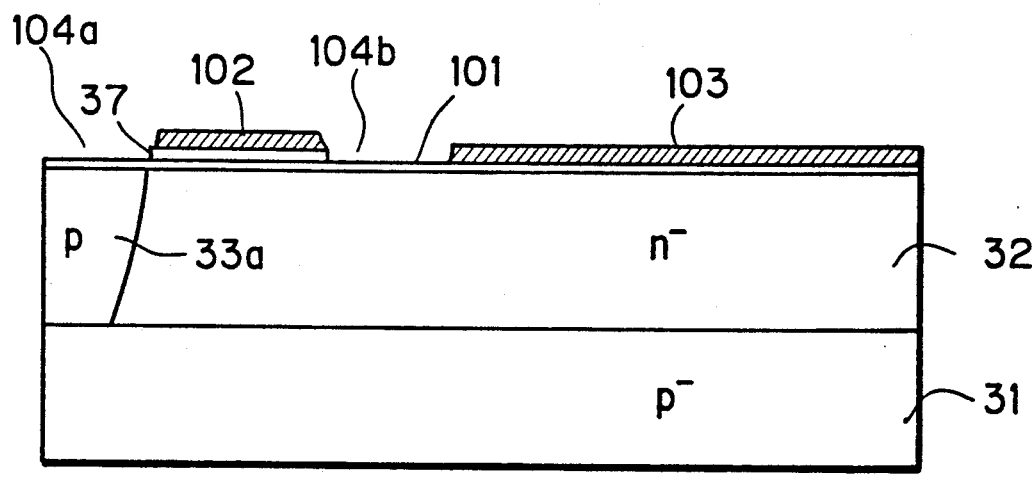

Then, after the surface oxidation film 100 is removed and an oxidation insulating film 101 and a polysilicon film are formed in this order over the entire surface of the $n^-$ epitaxial layer 32 and the p diffusion area 33a, the conduction film 37 is formed by etching the polysilicon film by using a resist 102 as a mask, as shown in FIG. 9B. Further, a resist 103 is formed with openings 104a and 104b formed on opposite sides of the conduction film 37.

Figure 9C:
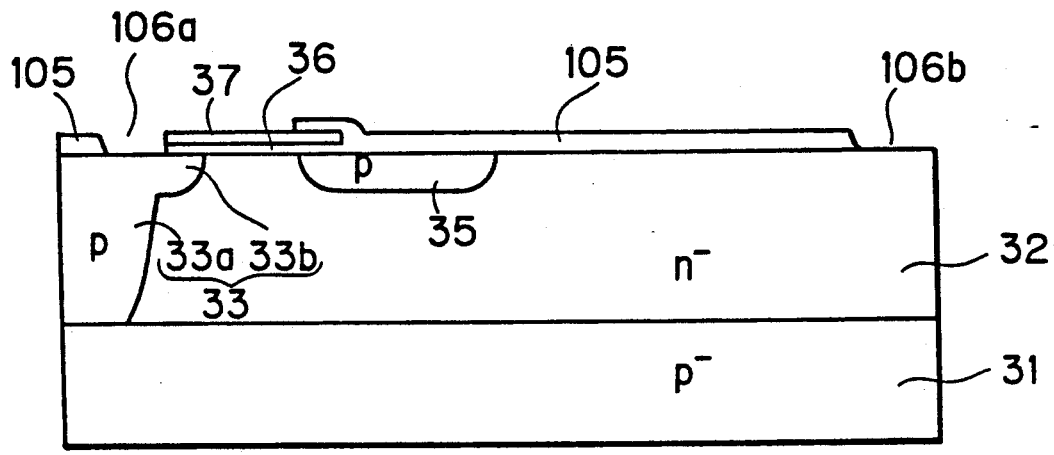

Then, p-type impurity such as boron is selectively implanted and diffused through the openings 104a and 104b to form the p diffusion regions 33b and 35 as shown in FIG. 9C. After that, the resists 102 and 103 are removed and a thermal oxidation film 105 which grows in diffusing the p-type impurity is patterned to form openings 106a and 106b. The insulating film 101 remaining under the conduction film 37 becomes an insulating film 36.

Figure 9D:
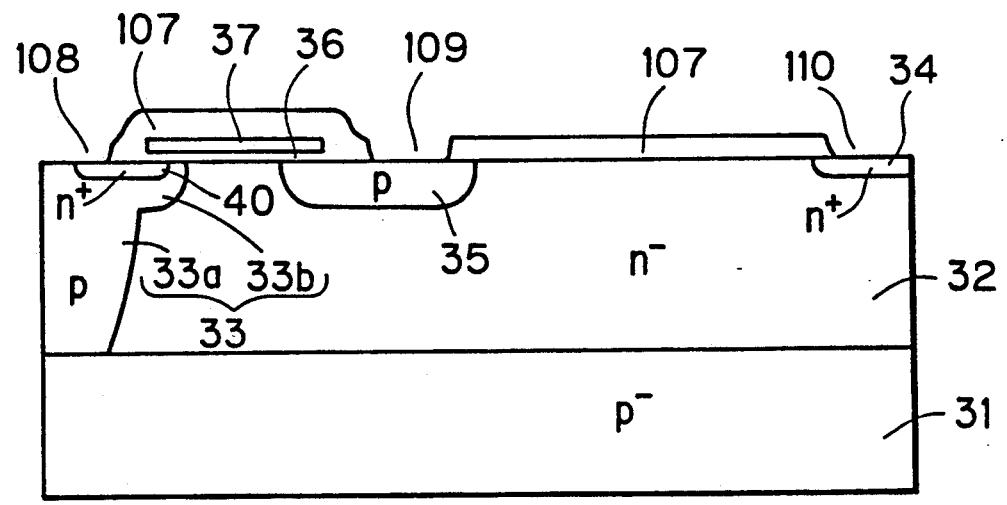

Then, n-type impurity such as phosphorus is selectively deposited and diffused through the openings 106a and 106b to form n+ diffusion regions 34 and 40 as shown in FIG. 9D. A channel of the MOSFET is formed by means of double diffusion through the openings 104a and 106a. Further, after a passivation film 107 is deposited on the oxidation film 105, contact holes 108, 109 and 110 are made in the passivation film 107.

Figure 9E:
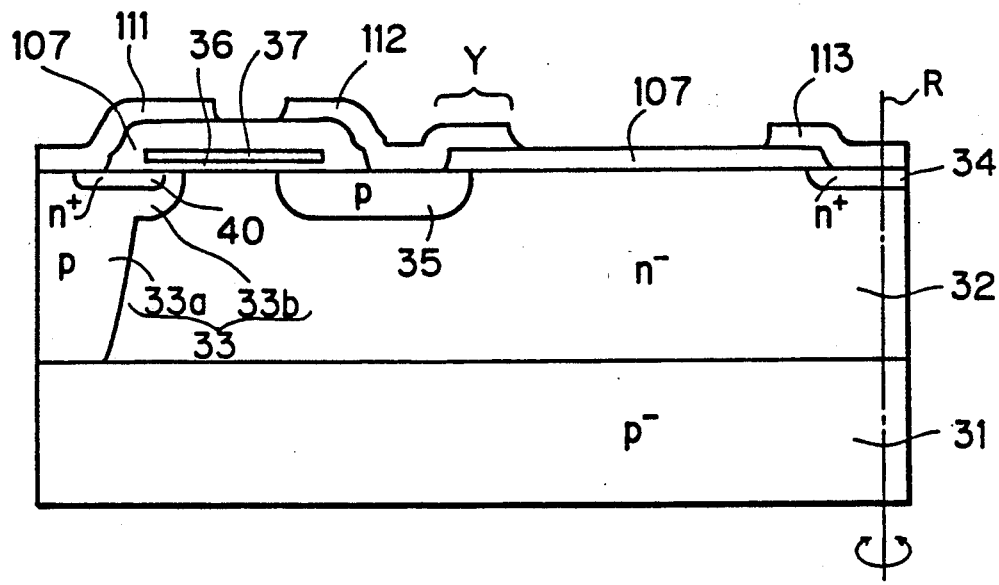

After that, electrode material such as Al-Si is deposited and patterned so that, as shown in FIG. 9E, a source electrode 111 in contact with the p diffusion region 33 and the n+ diffusion region 40 through the contact hole 108, a sense electrode 112 in contact with the p diffusion region 35 through the contact hole 109 and a drain electrode 113 in contact with the n+ diffusion region 34 through the contact hole 110 are formed. In this way, the MOSFET equivalent to the structure in FIG. 8 is formed. In a region Y in FIG. 9E, the passivation film 107 serves like the insulating film 38 in FIG. 8, and the sense electrode 112 serves like the conduction film 39.

Figure 10:
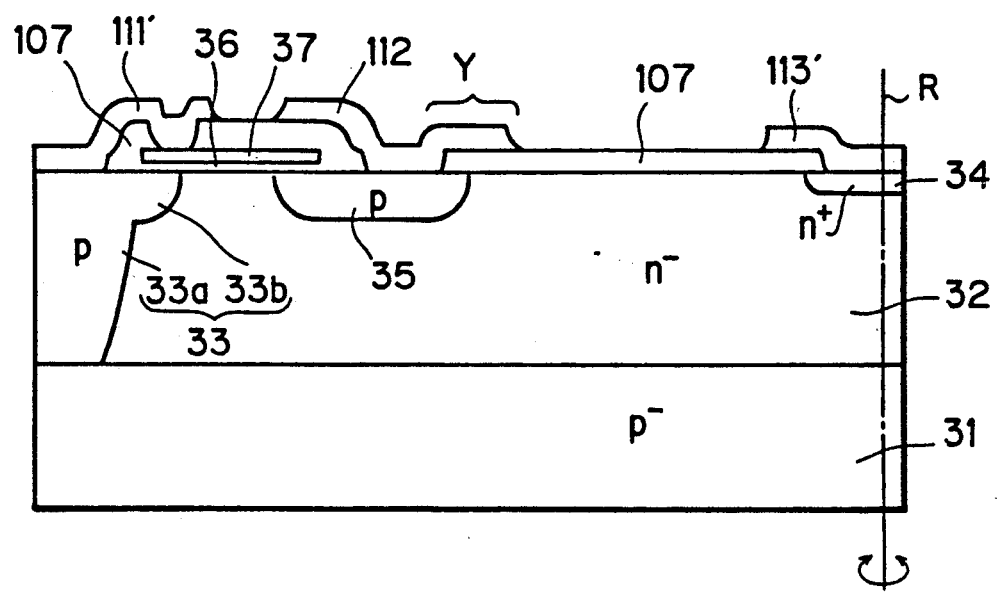

The steps of manufacturing the diode in FIG. 7 are the same as the above-mentioned manufacturing steps in FIGS. 9A to 9E except for the following points: That is, in the case of manufacturing the diode of FIG. 7, the n+ diffusion region 40 is not formed by masking the opening 106a by the oxidation film 105 in the step of FIG. 9C. In the step of FIG. 9D, a contact hole is formed in the passivation film 107 on the conduction film 37 in addition to the contact holes 108 to 110. Through those manufacturing steps, a diode equivalent to the structure of FIG. 7 is formed as shown in FIG. 10. Numerals 111' and 113' denote an anode electrode and a cathode electrode, respectively.

In the operation of the diode in FIG. 7, when the applied voltage of the anode terminal A gets higher than the applied voltage of a cathode terminal K by the threshold voltage or more, the diode turns on, and current flows from the anode terminal A to the cathode terminal K. On the other hand, when the applied voltage of the anode terminal A gets equivalent to or lower than the applied voltage of the cathode terminal K, the diode turns off, and current is blocked.

Figure 11:
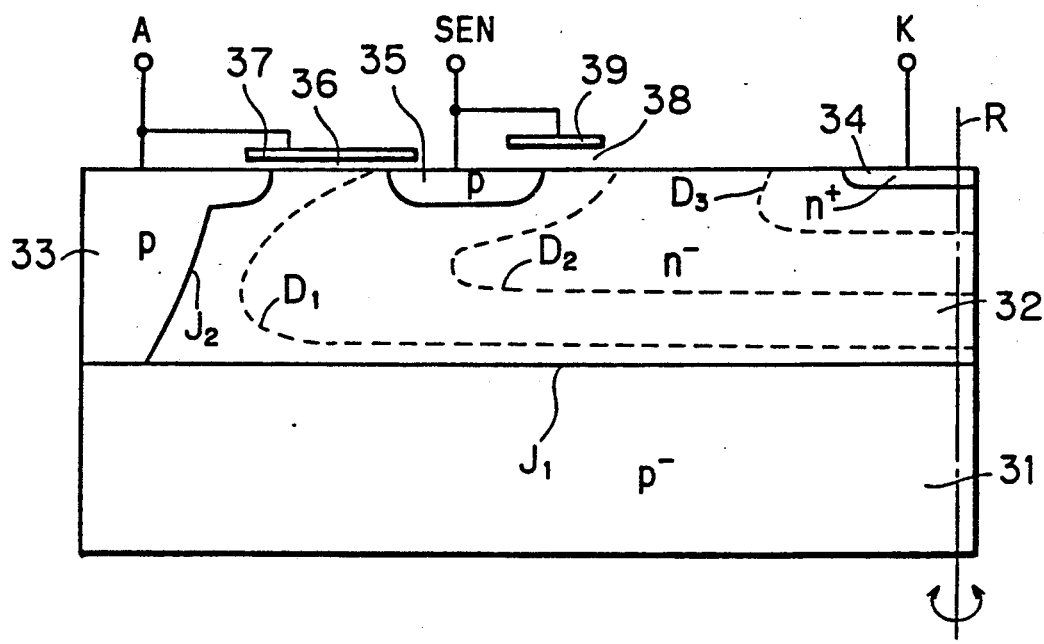
FIG. 11 is a sectional view showing the extension of a depletion layer in the diode in FIG. 7.

As the potential of the cathode terminal K rises with respect to the potential of the anode terminal A in the current blocked state, the end of a depletion layer which extends from a first pn junction $J_1$ between the p$^-$ semiconductor substrate 31 and the n$^-$ epitaxial layer 32 and a second pn junction $J_2$ between the p diffusion region 33 and the n$^-$ epitaxial layer 32 into the n$^-$ epitaxial layer 32 alters in such a way as $D_1 \rightarrow D_2 \rightarrow D_3$ as shown in FIG. 11. Since the first pn junction $J_1$ is a junction between p$^-$ and n$^-$ regions, the depletion layer extends toward both sides from the junction, but since the second pn junction $J_2$ is a junction between p and n$^-$ regions, the depletion layer extends toward only one side (the n$^-$ side) from the junction. Thus, in the one-dimensional system, that is, assuming that the first and second pn junctions $J_1$ and $J_2$ are infinite plain junctions, the second pn junction $J_2$ yields only half of the breakdown voltage that the first pn junction $J_1$ does, and the breakdown voltage of the diode is reduced. However, in this embodiment, the surface electric field is relieved and the breakdown voltage of the diode is increased because of the following two reasons that (1) similar to the convenional diode in FIG. 3, the extension of the depletion layer from the first pn junction $J_1$ causes the configuration of the depletion layer extending from the second pn junction $J_2$ to change, and as a result, the depletion layer extends more in the lateral direction (to the right in the figure) in the surface of the n$^-$ epitaxial layer 32, and that (2) the conductive films 37 and 39 and the p diffusion region 35 serve as a composite field plate, so that the depletion layer extends still more in the lateral direction (to the right in figure) in the surface of the n$^-$ epitaxial layer 32 due to the influence of the electric field from the composite field plate. Further, due to the composite field plate, the breakdown voltage gets less influenced by the state of electric charge in the surface of the n$^-$ epitaxial layer 32.

Figure 3:
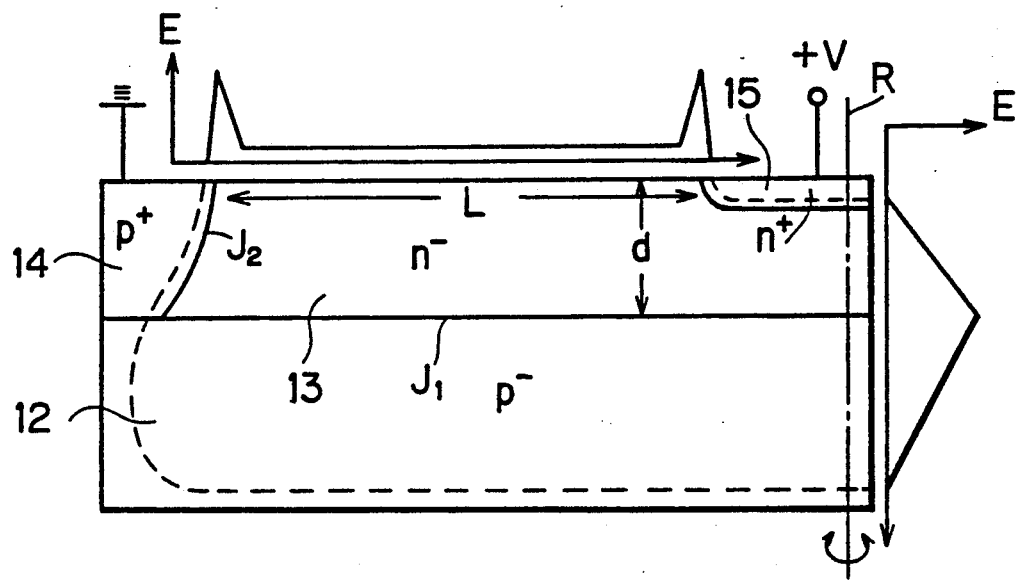
FIG. 3 is a sectional view showing a conventional high breakdown voltage diode.
Figure 4:
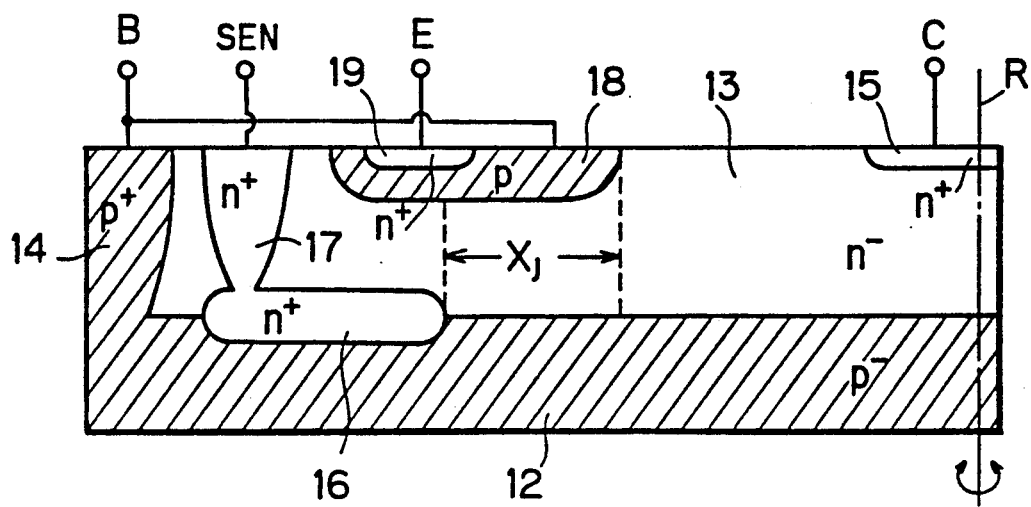
FIG. 4 is a sectional view showing a conventional high breakdown voltage bipolar transistor with a sense terminal.
Figure 5:
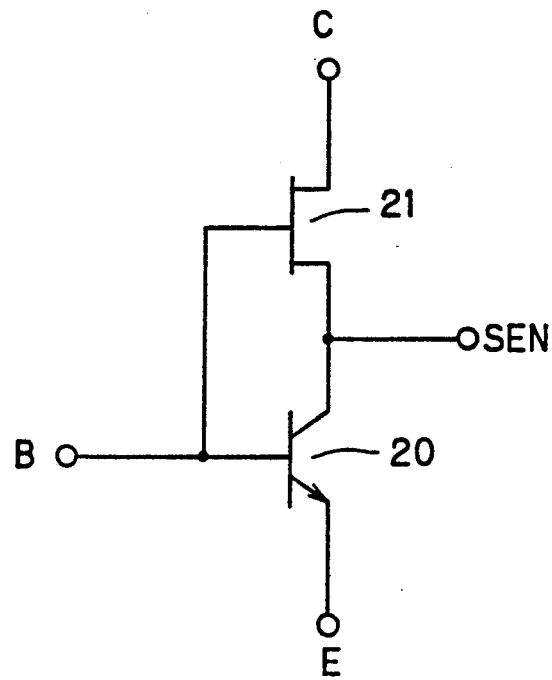
FIG. 5 is a circuit diagram showing an equivalent circuit of the transistor in FIG. 4.
Figure 6:
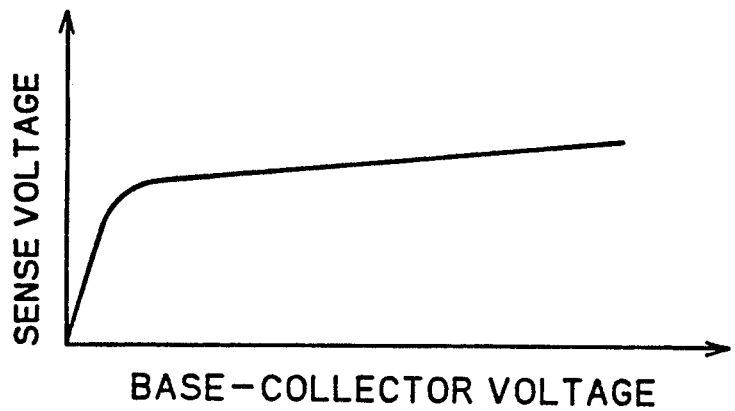
FIG. 6 is a graph showing a conventional sense voltage characteristic.

In the conventional diode in FIG. 3, since the breakdown voltage is increased only by the function of (1), the restriction shown in the formula (1) is imposed on the thickness and impurity concentration of the n$^-$ epitaxial layer 32. On the other hand, in the diode according to the present invention, in addition to the function (1) the breakdown voltage is also increased by the function (2), so that the restriction upon the thickness and impurity concentration of the n$^-$ epitaxial layer 32 is relieved. This will be explained in detail hereinafter.

Figure 12:
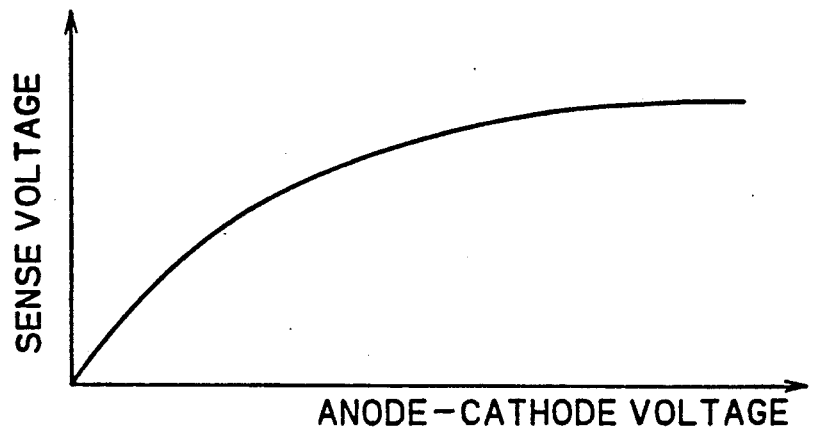
FIG. 12 is a graph showing a sense voltage characteristic in this invention.

As the potential of the cathode terminal K rises with respect to the potential of the anode terminal A and the end of the depletion layer alters in such a way as $D_1 \rightarrow D_2 \rightarrow D_3$, the potential of the floating p diffusion region 35 and therefore the potential of the sense terminal SEN also varies. Until the end of the depletion layer gets to be at the state of $D_1$, the potential of the sense terminal SEN varies in accordance with the potential of the cathode terminal K, and thereafter it slowly rises in accordance with capacity coupling caused by a parasitic capacity between the sense terminal SEN and the anode terminal A and a parasitic capacity between the sense terminal SEN and the cathode terminal K. The voltage between the anode and cathode in the state of $D_1$ in general is only several volts or so, and thus the change in the sense voltage before the state of $D_1$ occupies simply the initial small part of the sense voltage characteristic. Because of this, the sense voltage characteristic in this embodiment gets to be smooth almost at all the points of the voltage between the anode and cathode as shown in FIG. 12, and it is more easily sensed compared to the conventional characteristic.

The parasitic capacity between the sense terminal SEN and anode terminal A is much larger than the parasitic capacity between the sense terminal SEN and the cathode terminal K, so that the potential of the p diffusion region 35 is considerably influenced by the parasitic capacity between the sense terminal SEN and the anode terminal A. Since a main part of this parasitic capacity is formed by the overlapping part of the conduction film 37 and the p diffusion region 35 and the insulating film 36 therebetween, the potential of the p diffusion region 35 considerably depends upon the thickness of the insulating film 36 and the length of the overlap of the conduction film 37 and the p diffusion region 35. The thickness of the insulating film 36 can be accurately controlled by the process control upon manufacturing, and the length of the overlap can be also accurately controlled because the p diffusion region 35 is formed by self-alignment with respect to the conduction film 37. Thus, a sense voltage characteristic which hardly varies can be obtained. On the other hand, the sense voltage characteristic does not depend upon the distance between the p diffusion regions 33 and 35 so much. However, even if it does, since the p diffusion regions 33 and 35 are formed by self-alignment, the distance therebetween can be accurately controlled, and in this point also, the variation of the sense voltage characteristic is inhibited.

In the operation of the MOSFET in FIG. 8, when a voltage higher than the threshold voltage with respect to the voltage of the source terminal S is applied to the gate terminal G in the state that a voltage higher than the voltage of the source terminal S is applied to the drain terminal D, the MOSFET turns on. That is, the p diffusion region 33 just under the conduction film 37 is inverted to form an n channel, and current flows from the drain terminal D to the source terminal S through the channel. On the other hand, when the applied voltage to the gate terminal G is equivalent to or lower than the applied voltage to the source terminal S, the MOSFET turns off. That is, the channel disappears and current is blocked.

The operation by which high breakdown voltage is implemented and the operation by which good sense voltage characteristic can be obtained while current is blocked are completely the same as in the aforementioned case of the diode in FIG. 7.

Then, the operation by which high breakdown voltage is implemented will be discussed in detail, comparing the conventional diode in FIG. 3 with the diode in FIG. 7 according to the present invention. The high breakdown voltage implementing operation of the MOSFET in FIG. 8 according to the present invention is completely the same as the diode in FIG. 7, as stated above.

In the structure of the conventional diode in FIG. 3, usually, either of the first pn junction $J_1$, the second pn junction $J_2$ or the $n^+$-$n^-$ junction between the $n^-$ epitaxial layer 13 and the $n^+$ diffusion region 15 brings about the maximum electric field. If a distance L from the second pn junction $J_2$ to the $n^+$ diffusion region 15 is sufficiently large, the electric field of the $n^+$-$n^-$ junction is sufficiently low, and therefore the first and second pn junctions $J_1$ and $J_2$ alone may be taken into consideration. The second pn junction $J_2$ generally brings about a larger electric field than the first pn junction $J_1$, but upon the optimization of the concentration N and thickness d of the $n^-$ epitaxial layer 13 (the formula (1)), the second pn junction $J_2$ can have its electric field made lower than the first pn junction $J_1$. At this time, the breakdown voltage of the diode is determined by the first pn junction $J_1$. Thus, the limit of the optimization exists in the case where the electric fields of the first and second pn junctions $J_1$ and $J_2$ are the same, and the precondition is that the $n^-$ epitaxial layer 13 has been completely depleted. Allowing for the above discussion, the state of the limit is shown as a simplified view in FIG. 13.

Figure 13:
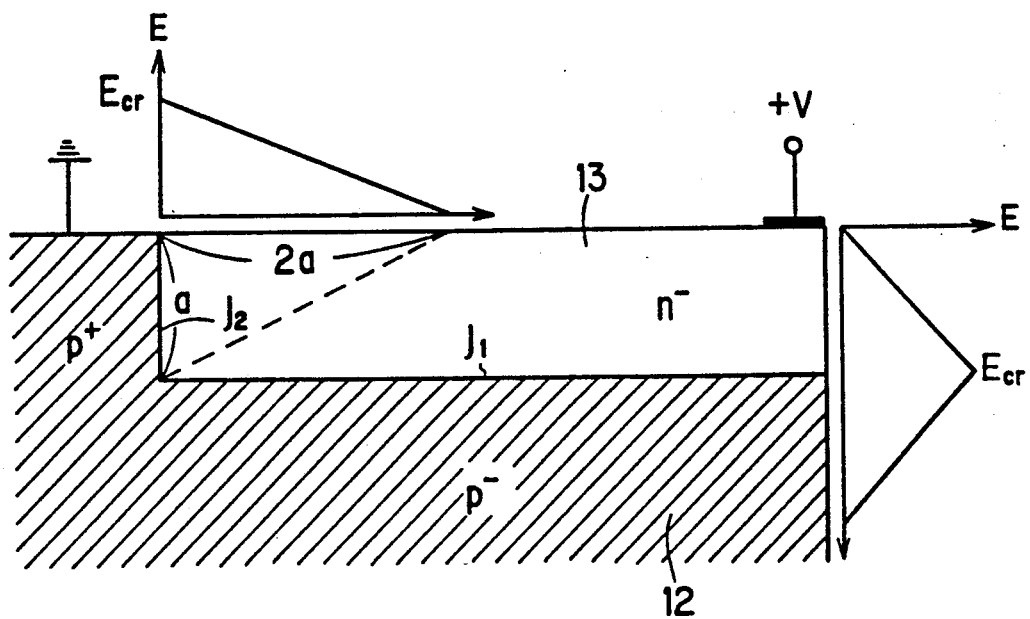
FIG. 13 and FIG. 14 are sectional views showing a simplified conventional diode.

In FIG. 13, the $n^-$ epitaxial layer 13 has been completely depleted, while the $n^+$ diffusion region 15 is omitted as it is sufficiently shallow. The thickness of the $n^-$ epitaxial layer 13 is designated by a, and the boundary between a region of the depletion layer in which a line of electric force by donor in the $n^-$ epitaxial layer 13 reaches the first pn junction $J_1$ and a region of the depletion layer in which the line of ellectric force reaches the second pn junction $J_2$ is shown by a broken line.

Voltage drop and electric field at the second pn junction $J_2$ are approximated by equations as follows:

$$V = \frac{qN_D}{\epsilon\epsilon_O}\int_0^{2a} \frac{t}{2} dt = \frac{a^2 qN_D}{\epsilon\epsilon_O} \quad (3)$$

$$E = \frac{2a \times a}{2} \times \frac{qN_D}{\epsilon\epsilon_O} \times \frac{1}{a} = \frac{aqN_D}{\epsilon\epsilon_O} = E_{cr} \quad (4)$$

where q is an amount of electric charge of electrons, $N_D$ is an impurity concentration of the $n^-$ epitaxial layer 13, $\epsilon_O$ is a dielectric constant of vacuum and $\epsilon$ is a dielectric constant of a semiconductor material. The voltage drop and the electric field at the first pn junction $J_1$ is equal to those obtained by the equations (3) and (4), by making approximation in one-dimensional calculation and assuming that the concentrations of the $n^-$ epitaxial layer 3 and the $p^-$ semiconductor substrate 12 are equal. Hence, when the electric field E in the aforementioned state is defined as a critical electric field $E_{cr}$, it can be said that the limit state of this diode is that shown in FIG. 13.

Figure 14:
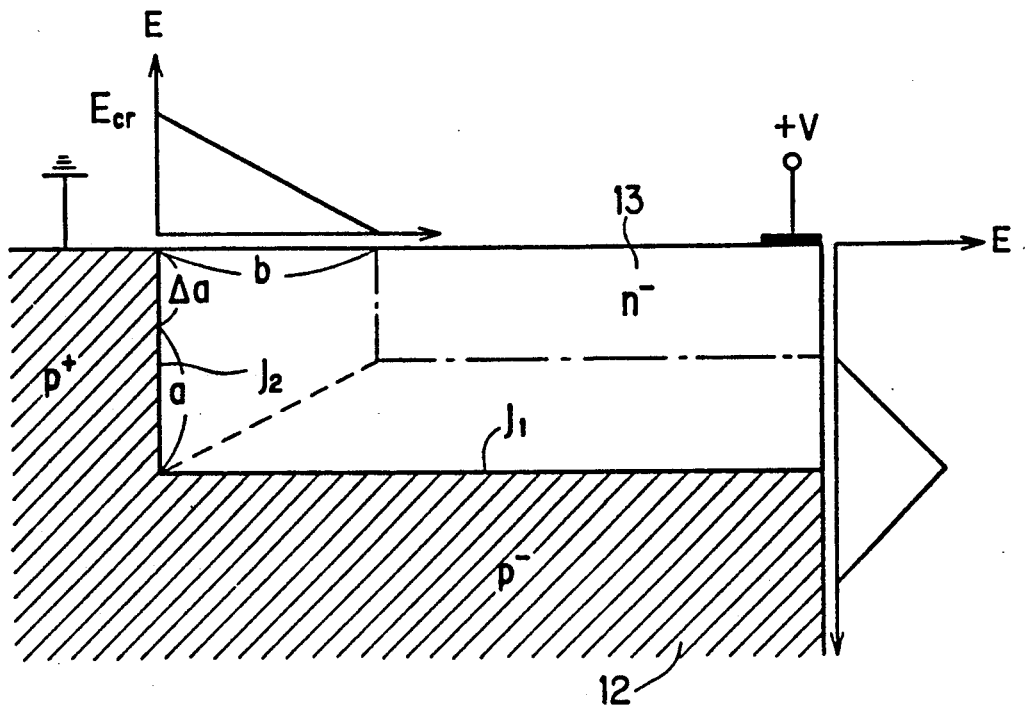

Then, a case where the thickness of the $n^-$ epitaxial layer 13 gets thicker from the state shown in FIG. 13 by $\Delta a$ will be discussed. FIG. 14 shows the state in this case. A broken line represents the same as in FIG. 13, and an inclination is the same as in FIG. 13. A dot-dash line shows the end of the depletion layer. In the state shown in FIG. 14, since the maximum electric field of the second pn junction $J_2$ gets larger than the maximum electric field of the first pn junction $J_1$, the maximum electric field of the second pn junction $J_2$ is equal to $E_{cr}$. Since the maximum electric field $E_{cr}$ of the second pn junction $J_2$ equals $E_{cr}$ in the equation (4), an equation (5) is obtained as follows:

$$E_{cr} = \frac{\left(2a + 2\Delta a - \frac{b}{2}\right) \cdot \frac{b}{2}}{a + \Delta a} \cdot \frac{qN_D}{\epsilon\epsilon_O} = \frac{aqN_D}{\epsilon\epsilon_O} \quad (5)$$

The voltage drop from the second pn junction $J_2$ is expressed as follows:

$$V = \int_0^b \frac{\left(2a + 2\Delta a - b + \frac{t}{2}\right) \cdot \frac{t}{2}}{a + \Delta a - \frac{b}{2} + \frac{t}{2}} \cdot \frac{qN_D}{\epsilon\epsilon_O} dt$$

$$= \left\{ -\frac{b^2}{4} + (a + \Delta a) \cdot b + 2\left(a + \Delta a - \frac{b}{2}\right)^2 \cdot \ln\left(\frac{a + \Delta a - \frac{b}{2}}{a + \Delta a}\right) \right\} \cdot \frac{qN_D}{\epsilon\epsilon_O}$$

When an equation obtained from the equation (5)

$$b = 2(a + \Delta a - \sqrt{\Delta a^2 + \Delta a \, a}) \quad (7)$$

$(\because b < 2a)$ is substituted into the euqation (6), an equation is obtained as follows:

$$V = \left\{ a^2 + a\Delta a + (\Delta a^2 + a\Delta a) \cdot \ln\left(\frac{\Delta a}{a + \Delta a}\right)\right\} \cdot \frac{qN_D}{\epsilon\epsilon_O} \quad (8)$$

For example, the voltage when the thickness of the epitaxial layer 13 is doubled is calculated by substituting $\Delta a = a$ into the equation (8) as follows;

$$V = 2a^2\left(1 + \ln\frac{1}{2}\right) \cdot \frac{qN_D}{\epsilon\epsilon_O} \approx 0.614 a^2 \frac{qN_D}{\epsilon\epsilon_O} \quad (9)$$

and the breakdown voltage is reduced by approximately 40% to the state of FIG. 13.

In the diode in FIG. 7 according to the present invention, the conduction film 37 is connected to the p diffusion region 33 to form a field plate to the p diffusion region 33. The p diffusion region 35 is floating in the completely depleted $n^-$ epitaxial layer 32 in a high voltage blocking state and fixed to a certain potential because of the capacity coupling. The conduction film 39 is connected to the p diffusion region 35 to form a field plate to the p diffusion region 35. In this way, in the diode in FIG. 7 according to the present invention, a composite field plate is composed of the conduction film 37, the p diffusion region 35 and the conduction film 39, and the function of the composite field plate can be roughly approximated by a single field plate.

Figure 15:
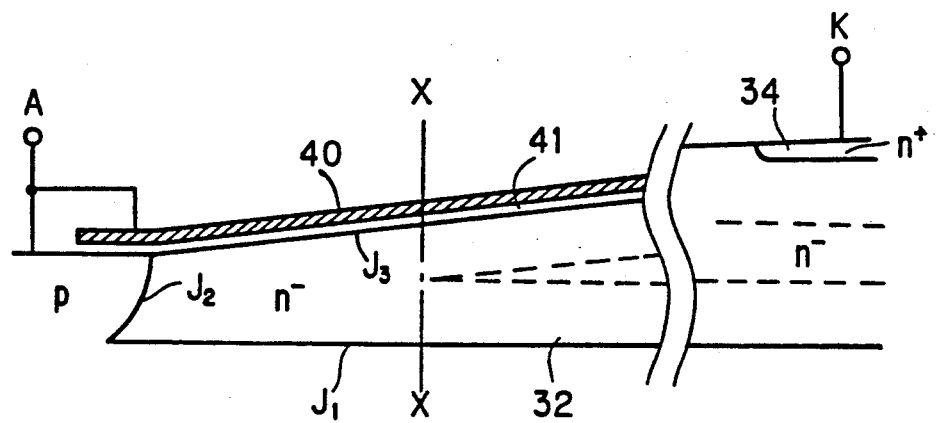
FIG. 15 is a sectional view presented for analyzing the diode according to the present invention.

Now, for the convenience of calculating the breakdown voltage of the diode in FIG. 7 according to the present invention and the usable thickness of the $n^-$ epitaxial layer 32, a structure shown in FIG. 15 is assumed. In FIG. 15, the $n^-$ epitaxial layer 32 gets gradually thicker to the right, and it is assumed that there is no concentration of electric field in the end of a field plate 40. When a field plate is provided, generally, the maximum electric field of the second pn junction $J_2$ is considerably low, and hence the breakdown voltage of the diode is determined by the first pn junction $J_1$ or the third junction $J_3$ in the surface of the $n^-$ epitaxial layer 32. Accordingly, the second pn junction $J_2$ is ignored hereinafter. A broken line represents the end of the depletion layer.

Now, when this diode keeps the voltage just before avalanche, the thickness of the $n^-$ epitaxial layer 32 along the line X—X of FIG. 15 represents the maximum thickness of the $n^-$ epitaxial layer 32 which is applicable in this field plate structure. This is because assuming that the $n^-$ epitaxial layer 32 in FIG. 15 has a uniform thickness equal to the thickness in the X—X section, since the depletion layers extending from the first pn junction $J_1$ and the third junction $J_3$ come into contact just before avalanche, the maximum electric field is fixed at this time, and when a voltage is further applied, eventually avalanche is caused in the first pn junction $J_1$ near a part under the $n^+$ diffusion region 34. This is completely the same situation as the avalanche in the case of the optimum structure of the conventional diode in FIG. 3.

Figure 16:
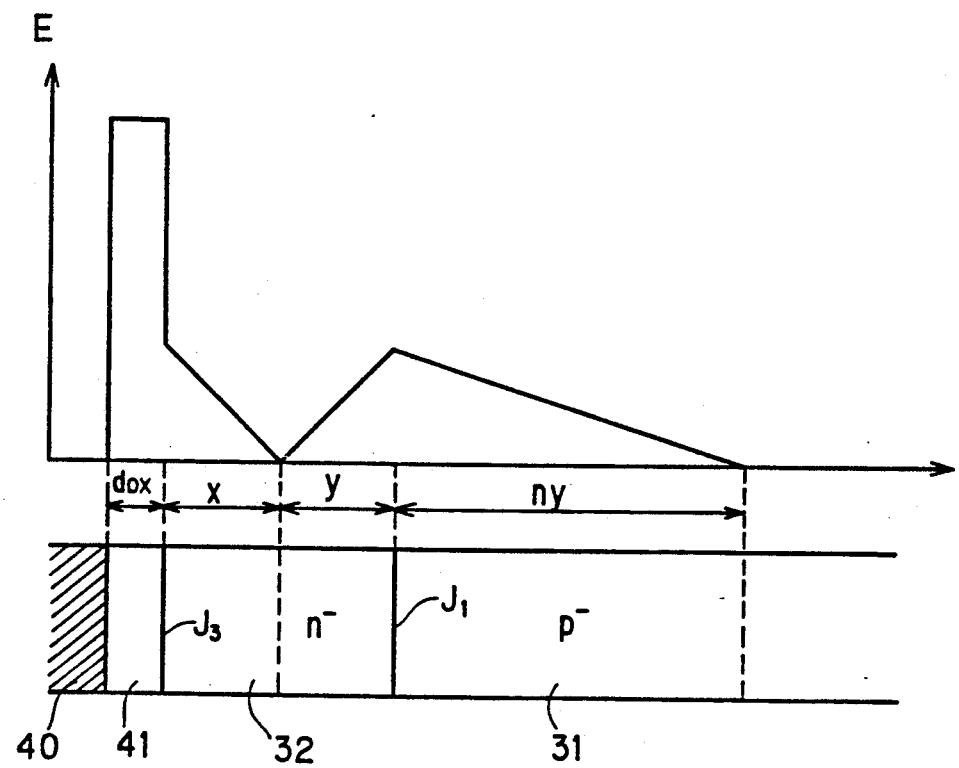
FIG. 16 to FIG. 19 are diagrams showing the electric field distribution in a section along X—X of FIG. 15.

FIG. 16 shows an electric field distribution in the X—X section. $d_{OX}$ denotes the thickness of an insulating film 41, x denotes the distance from the third junction $J_3$ to the contact point of the depletion layers, y denotes the distance from the first pn junction $J_1$ to the contact point of the depletion layers, and ny denotes the distance from the first pn junction $J_1$ to the end of the depletion layer in the $p^-$ semiconductor substrate 31.

Assuming that the concentrations of the $n^-$ epitaxial layer 32 and the $p^-$ semiconductor substrate 31 are $N_D$ and $N_A$, respectively, $n = N_D/N_A$ is satisfied.

Because holding voltages of the first and third junctions $J_1$ and $J_3$ are equal, an equation is obtained as follows:

$$\frac{(1+n)y \cdot qN_D y}{2\epsilon\epsilon_O} = x \cdot \frac{qN_D x}{2\epsilon\epsilon_O} + d_{ox} \cdot \frac{qN_D x}{\epsilon'\epsilon_O} \quad (10)$$

where $\epsilon'$ is a dielectric constant of the insulating film 41. Now, the relative dimensions between x and y will be discussed.

(1) $X = y$

Figure 17:
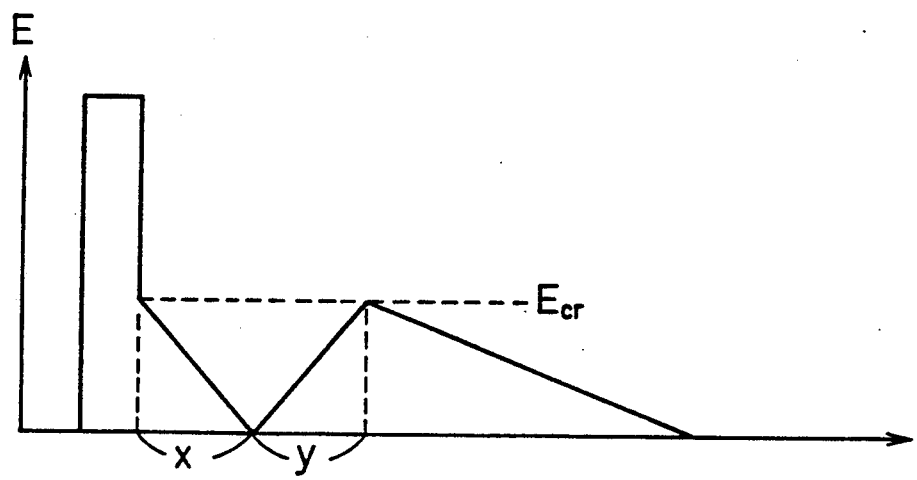

When this relation is satisfied, as shown in FIG. 17, the first and third junctions $J_1$ and $J_3$ simultaneously reach critical electric field $E_{cr}$. Substituting $x=y$ into the equation (10), an equation is obtained as follows:

$$x = y = \frac{2d_{ox}\epsilon}{n\epsilon'} \quad (11)$$

Since the maximum thickness of the epitaxial layer 13 in the conventional structure in FIG. 3 is x (=y), as will be recognized from the following equation (12), the epitaxial layer 32 whose thickness doubles that of the conventional structure can be used in the structure according to the present invention.

$$\frac{X+Y}{X} = 2 \quad (12)$$

(2) $x > y$

Figure 18:
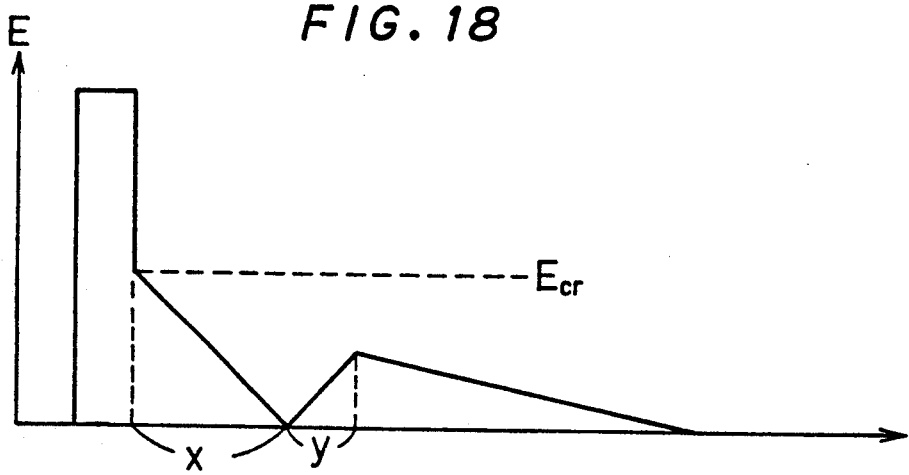

When this formula is satisfied, as shown in FIG. 18, the third junction $J_3$ previously reaches the critical electric field $E_{cr}$. The equation (10) is transformed to obtain the following equation:

$$(1+n)\frac{y^2}{x^2} = 1 + \frac{2d_{ox}\epsilon}{x\epsilon'} \quad (13)$$

Substituting $(y^2/x^2) < 1$ obtained from $x < y$ into the equation (13), a formula is obtained as follows:

$$n > \frac{2d_{ox}\epsilon}{x\epsilon'} > 0 \quad (14)$$

Since the maximum thickness of the epitaxial layer 13 in the conventional structure of FIG. 3 equals x, the improvement ratio of the thickness of the epitaxial layer 13 is obtained by transforming the equation (10) as follows:

$$\frac{x+y}{x} = 1 + \sqrt{\frac{1}{1+n}\left(1 + \frac{2d_{ox}\epsilon}{x\epsilon'}\right)} \quad (15)$$

Applying the formula (14) to the equation (15), or substituting 0 and n to $(2d_{OX}\epsilon/X\epsilon')$ of the formula (14), respectively, makes the formula as follows:

$$1 + \frac{1}{1+n} < \frac{x+y}{x} < 2 \quad (16)$$

(3) $x < y$

Figure 19:
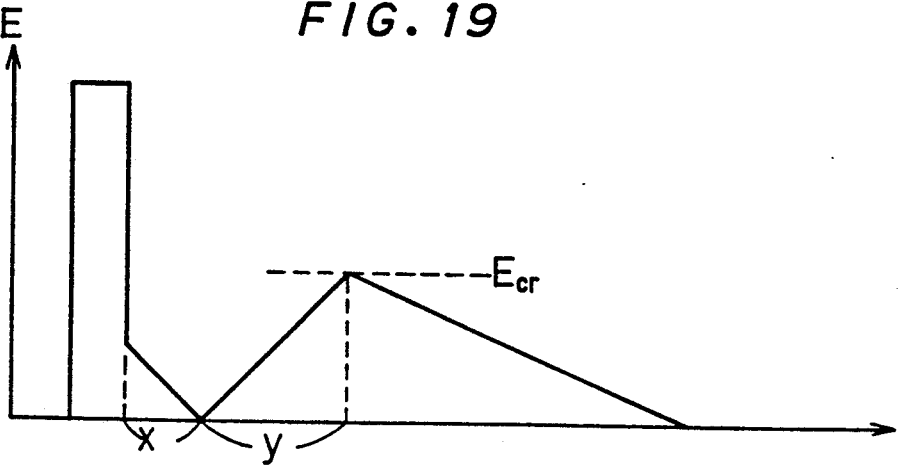

When this formula is statisfied, as shown in FIG. 19, the first pn junction $J_1$ previously reaches the critical electric field $E_{cr}$. Similar to the above case (2), substituting $(x^2/y^2)<1$ into the equation (13), a formula is obtained as follows:

$$n < \frac{2d_{ox}\epsilon}{x\epsilon'} \tag{17}$$

Since the maximum thickness of the epitaxial layer 13 in the conventional structure of FIG. 3 equals y, the improvement ratio of the thickness of the epitaxial layer 13 is obtained by transforming the equation (10) as follows:

$$\frac{x+y}{y} = 1 + \sqrt{\frac{1+n}{1+\frac{2d_{ox}\epsilon}{x\epsilon'}}} \tag{18}$$

Applying the formula (17) to the equation (18), or substituting $\infty$ and n into $(2d_{ox}\epsilon/x\epsilon')$ of the equation (18), respectively, a formula is obtained as follows:

$$1 < \frac{X+Y}{y} < 2 \tag{19}$$

Figure 20:
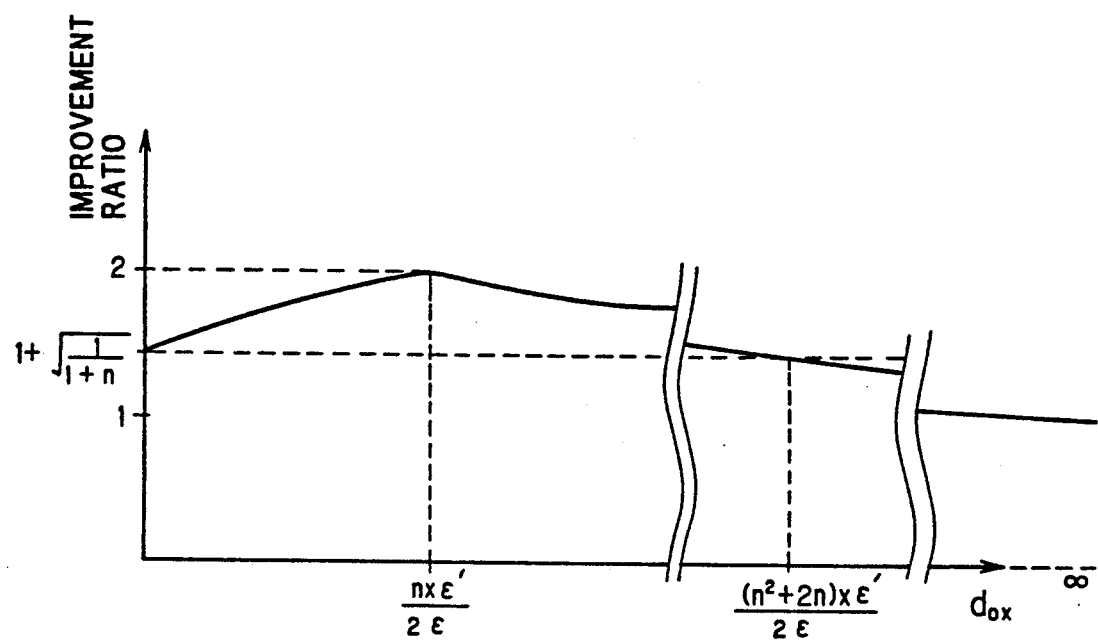
FIG. 20 is a graph showing the variation in the thickness improvement ratio of an epitaxial layer with respect to the variation in the thickness of an insulating film.

FIG. 20 shows the results in the above (1), (2) and (3) all together with a graph. The vertical axis represents the thickness improvement ratio of the epitaxial layer and the lateral axis represents the thickness $d_{OX}$ of the insulating film 41 under the field plate 40. In FIG. 20, when $d_{OX}=0$ is satisfied, the improvement ratio equals $$1 + \sqrt{1/(1+n)},$$

and when $d_{OX}=n\times\epsilon'/2\epsilon$, the improvement ratio takes the maximum value 2. When $d_{OX}$ is made still larger, the improvement ratio monotonously decreases, and when $d_{OX}\rightarrow\infty$, the improvement ratio gets to be 1. $d_{OX}$ which satisfies $d_{OX}>n\times\epsilon'/2\epsilon$ and by which the improvement ratio becomes $$1 + \sqrt{1/(1+n)}$$

is $(n^2+2n)\times\epsilon'/2\epsilon$. Generally, $1<n<2$ is satisfied, and therefore $x/2<d_{OX}<x$, allowing for $\epsilon'/\epsilon\approx\frac{1}{3}$ in $SiO_2$. Such a film thickness $d_{OX}$ is ten times as large as that of an ordinary oxidation film under the field plate. This makes it apparent that the improvement ratio of the thickness of the epitaxial layer is $$1 + \sqrt{1/(1+n)}$$

at the smallest if the film thickness $d_{OX}$ of the insulating film 41 under the field plate 40 has an ordinary thickness.

As a result of the above discussion, in the diode of FIG. 7, it is desirable that the thickness of each of the insulating films 36 and 38 is $nz\epsilon'/2\epsilon$ or under, where z is the thickness of the epitaxial layer 32. In this case, assuming that there is no concentration of electric field in the end of the field plate, the thickness of the epitaxial layer can be improved to be more than $$1 + \sqrt{1/(1+n)}$$

times as large as in the conventional diode of FIG. 3. Even if the concentration $N_D$ of the n$^-$ epitaxial layer 32 gets higher than the concentration $N_A$ of the p$^-$ semiconductor substrate 31, so that $n(=N_D/N_A)$ gets larger, it is found that the epitaxial layer 32 thicker than the conventional ones can be used. Thus, according to the present invention, the range of a usable thickness and concentration of the epitaxial layer 32 is wider than that of the conventional embodiment.

Figure 21:
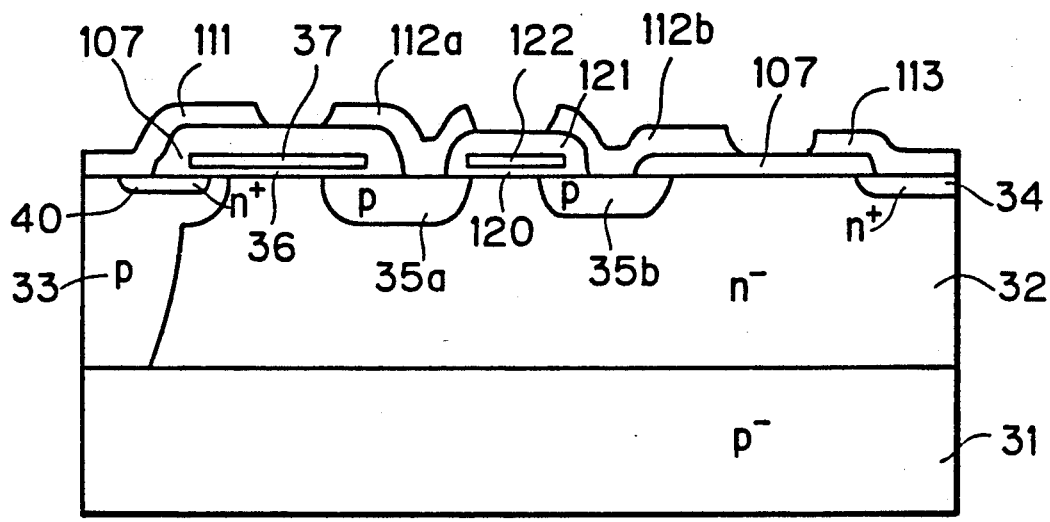

FIG. 21 is a sectional view showing a variation of the MOSFET shown in FIG. 9E. In this variation, two p diffusion regions 35a and 35b for sensing and two sense electrodes 112a and 112b connected to the regions 35a and 35b, respectively, are provided. Between the electrodes 112a and 112b, a conduction film 122 is provided which is kept floating by an insulating film 120 formed simultaneously with the insulating film 36 and a passivation film 121 formed simultaneously with a passivation film 107, so as to serve as a field plate. The extension of this variation is possible in that an arbitrary number of sense electrodes are provided.

Figure 22:
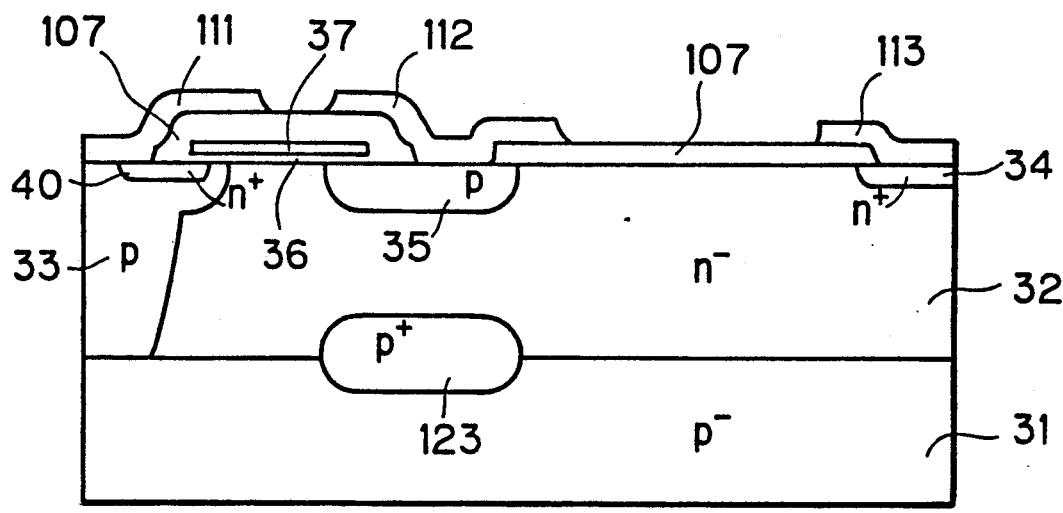

FIG. 22 is a sectional view showing another variation of the MOSFET shown in FIG. 9E. In this variation, in the interface between the p$^-$ semiconductor substrate 31 and the n$^-$ epitaxial layer 32, a p$^+$ buried region 123 is formed opposed to the p diffusion region 35. In a part of the n$^-$ epitaxial layer 32 between the p diffusion region 35 and the p$^+$ buried region 123, the depletion layers come easily in contact with each other from upper and lower sides, and consequently, the end of the depletion layer is increasingly urged to extend to the right in the surface of the n$^-$ epitaxial layer 32. This causes the surface electric field to be more effectively relieved.

The present invention is not limited to the aforementioned diodes and MOSFETs but is applicable to various semiconductor devices. FIGS. 23 to 38 are sectional views showing applications, and explanation about them will now be presented.

Figure 23:
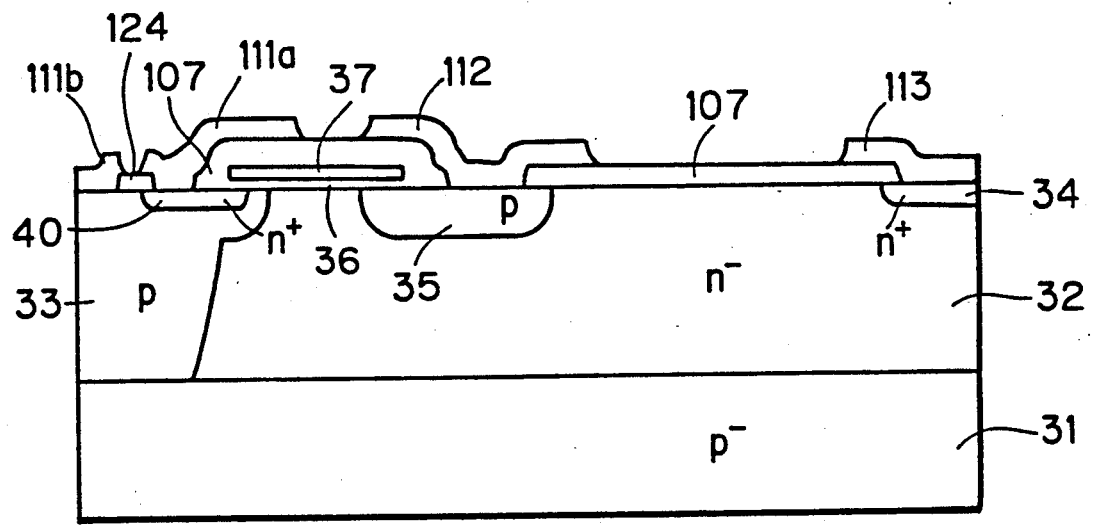

(A) Bipolar Transistor (FIG. 23)

Instead of the electrode 111 in FIG. 9E, electrodes 111a and 111b are provided which are insulated by a passivation film 124 formed simultaneously with a passivation film 107. The electrode 111b connected to the p diffusion region 33 serves as a base electrode, the electrode 111a connected to the n$^+$ diffusion region 40 serves as an emitter electrode, and the electrode 113 connected to the n$^+$ diffusion region 34 serves as a collector electrode.

Figure 24:
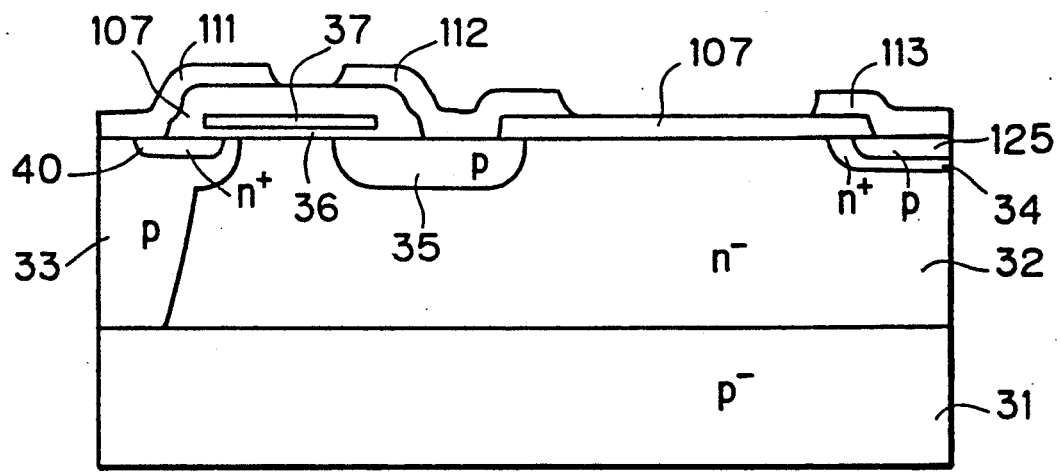

(B) IGBT (Insulated Gate Bipolar Transistor) (FIG. 24)

The n$^+$ diffusion region 34 is formed relatively large, and a p diffusion region 125 is provided in the n$^+$ diffusion region 34. The electrode 111 serves as an emitter electrode, the conduction film 37 serves as a gate electrode, and the electrode 113 connected to the p diffusion region 125 serves as a collector electrode.

On/Off is controlled by On/Off of a MOS structure similar to that of FIG. 9E. It is known that when this transistor turns on, the on state resistance is to be low due to the effect of the conductivity modulation in the n$^-$ epitaxial layer 32 serving as a base of this pnp transistor.

Figure 25:
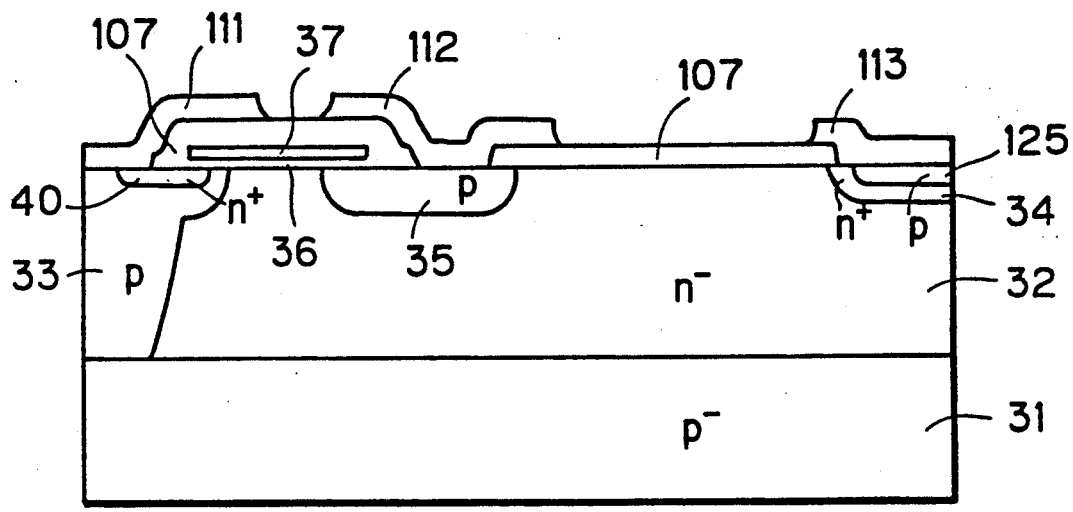

(C) Collector Short IGBT (FIG. 25)

In this IGBT, the p diffusion region 125 of the IGBT in FIG. 24 and the n⁻ epitaxial layer 32 are short-circuited through the collector electrode 113 and the n⁺ diffusion region 34. This is helpful to quickly pull electrons out when the transistor turns off, to quicken the turning-off speed.

Figure 26:
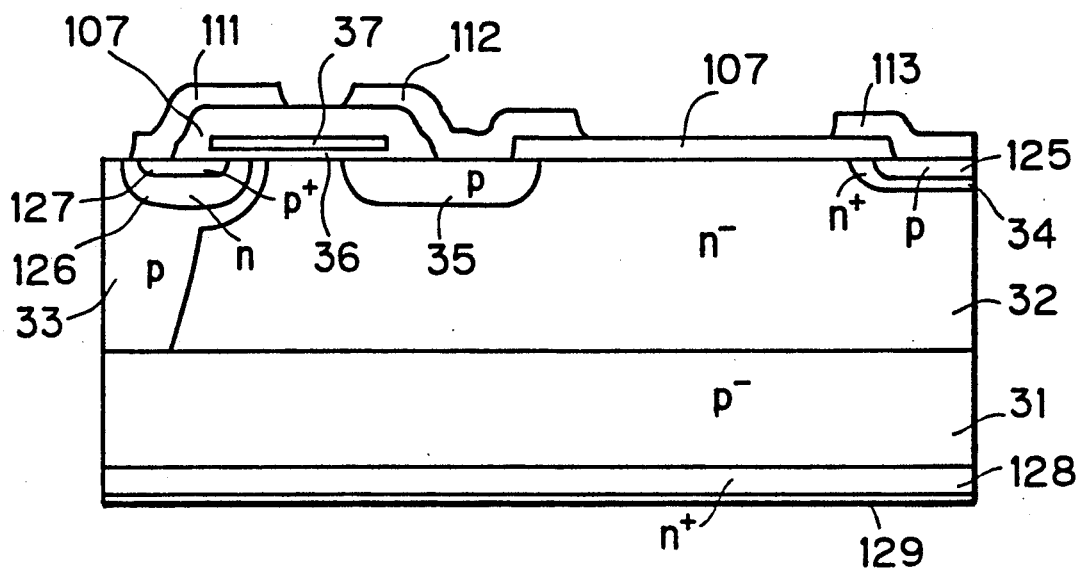

(D) MCT (MOS Controlled Thyristor) (FIG. 26)

The n⁺ diffusion region 34 is formed relatively large, and the p diffusion region 125 is provided in the n⁺ diffusion region 34. Further, an n diffusion region 126 is provided in the p diffusion region 33, and a p⁺ diffusion region 127 is provided in the n diffusion region 126. An n⁺ layer 128 and an electrode 129 are provided on the bottom surface of the p⁻ semiconductor substrate 31. The electrode 111 connected to the n diffusion region 126 and the p⁺ diffusion region 127 serve as a cathode electrode, the conduction film 37 serves as a gate electrode, and the electrode 113 connected to the p diffusion region 125 serves as an anode electrode.

When positive potential is applied to the gate electrode 37, an n channel in the surface of the p diffusion region 33 just under the gate electrode 37 turns on to cause electrons to flow in the anode electrode 113, and in response to this holes are injected from the p diffusion region 125 to the n⁻ epitaxial layer 32. The injected holes flow into the n diffusion region 126 to start the thyristor operation. On the other hand, when negative potential is supplied to the gate electrode 37, a p channel in the surface of the n diffusion region 126 just under the gate electrode 37 turns on, and the holes injected from the p diffusion region 125 are drawn into the p⁺ diffusion region 127 to stop the thyristor operation. The electrode 129 is kept at the same potential as that of the cathode electrode 111. The n⁺ layer 128 prevents the holes from passing to the p⁻ substrate 31.

Figure 27:
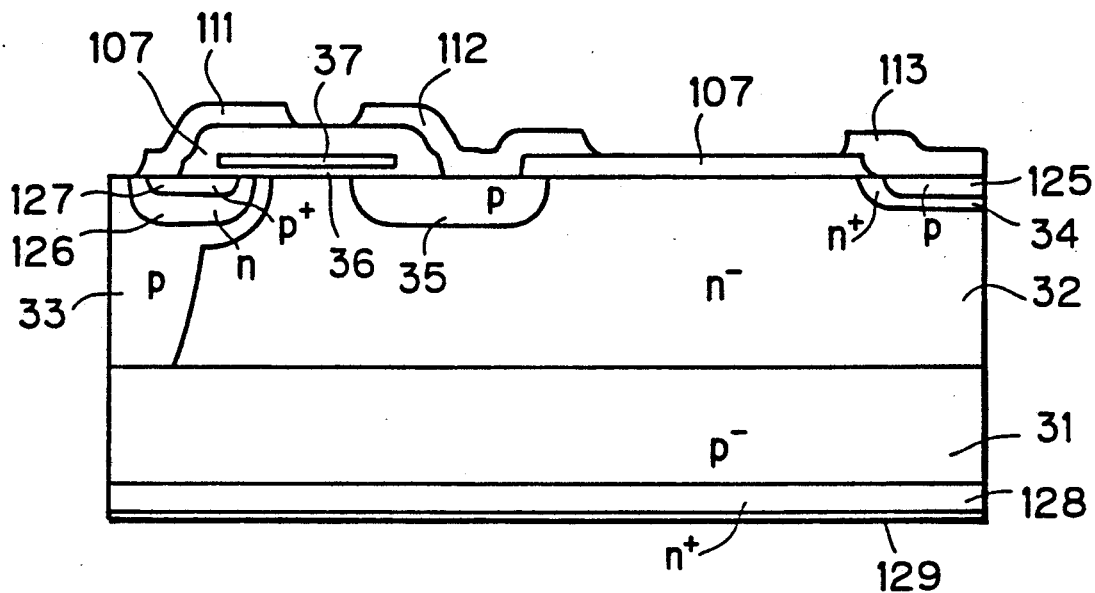

(E) Anode Short MCT (FIG. 27)

In this MCT, the p diffusion region 125 of the MCT of FIG. 26 and the n⁻ epitaxial layer 32 are short circuited through the anode electrode 113 and the n⁺ diffusion region 34. This is helpful to quickly pull electrons out when the transistor turns off, to quicken turning-off speed.

Figure 28:
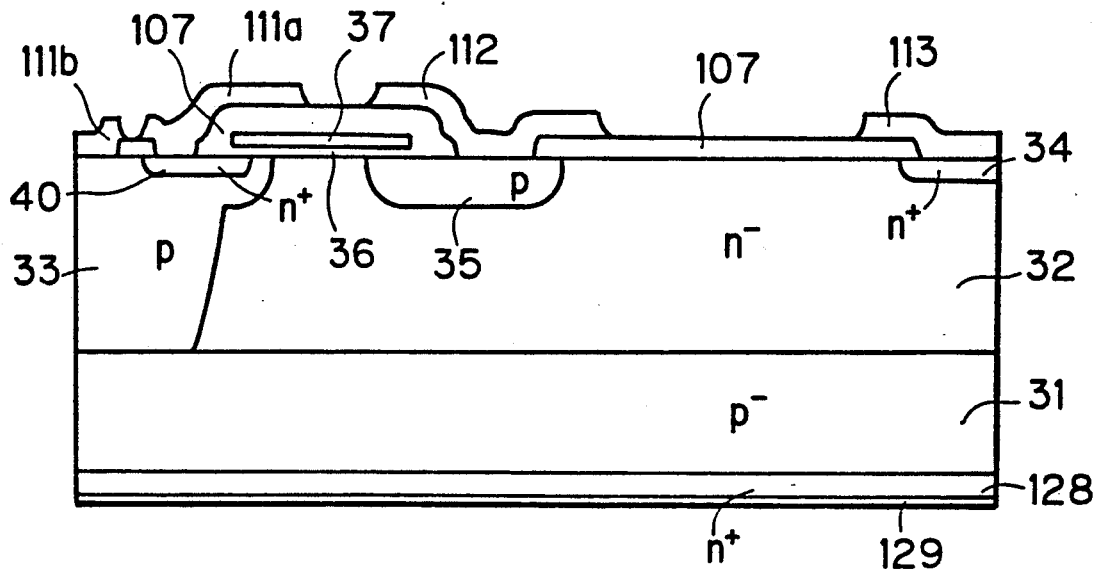

(F) Bipolar Transistor (FIG. 28)

In this bipolar transistor, the n⁺ layer 128 and the electrode 129 are provided in the bottom surface of the p⁻ substrate 31 of the bipolar transistor of FIG. 23. The electrode 129 is kept at the same potential as that of the emitter electrode 111a.

(G) IGBT (FIG. 29)

In this IGBT, the n⁺ layer 128 and the electrode 129 are provided in the bottom surface of the p⁻ substrate 31 of the IGBT of FIG. 24. The electrode 129 is kept at the same potential as that of the emitter electrode 111. The n⁺ layer 128 prevents the holes injected from the p diffusion region 125 to the n⁻ epitaxial layer 32 from passing to the p⁻ substrate 31.

Figure 30:
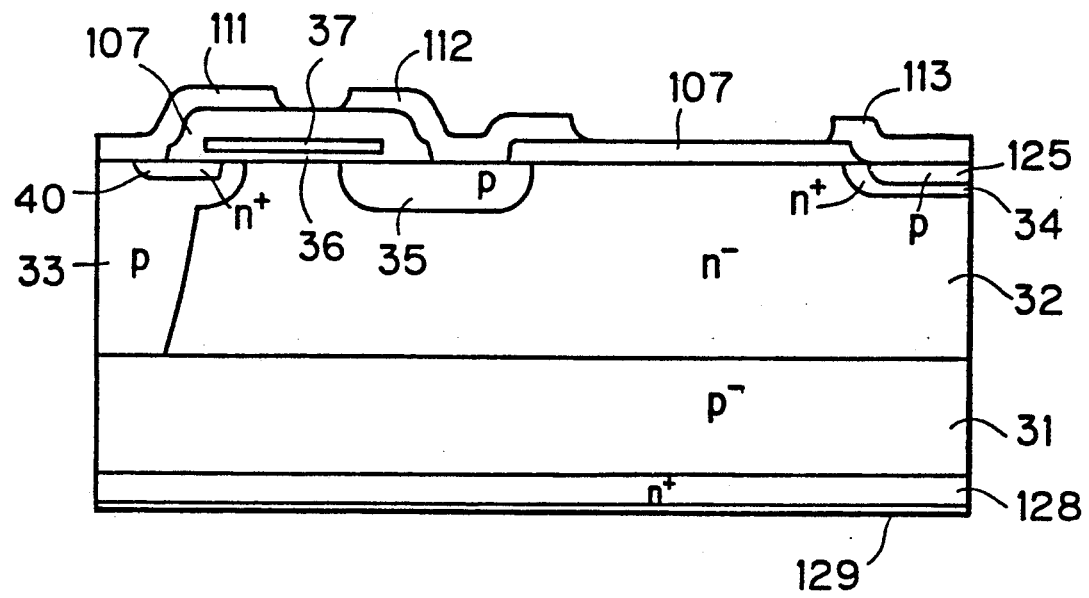

(H) Collector Short IGBT (FIG. 30)

Figure 29:
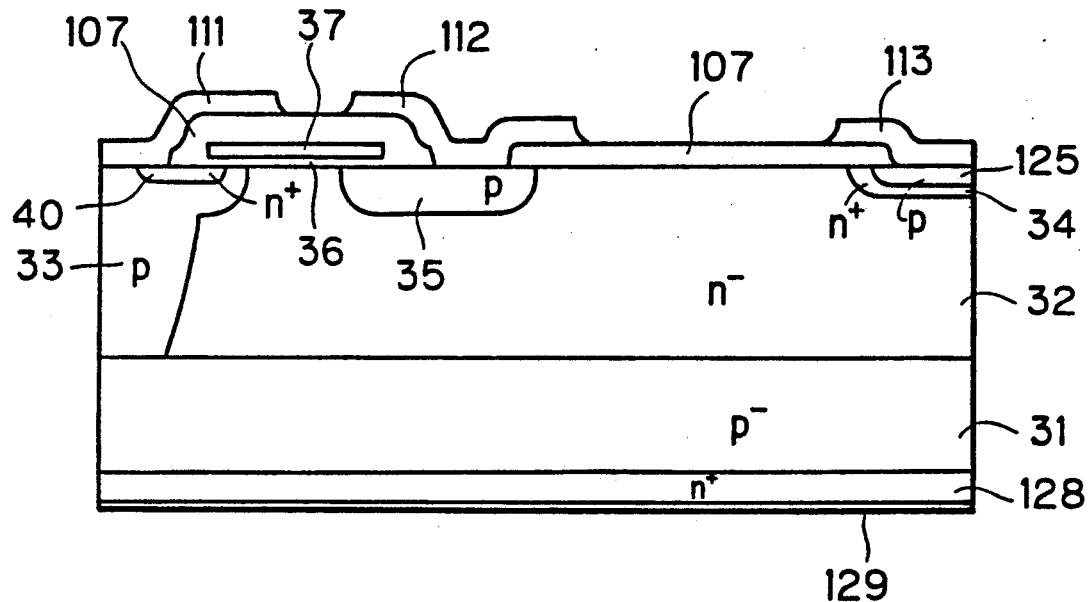

This IGBT is a combination of the IGBT of FIG. 25 and the IGBT of FIG. 29.

(I) IGBT (FIG. 31)

In this IGBT, the n⁺ layer 128 of the IGBT of FIG. 29 is provided not all over but on a part of the bottom surface of the p⁻ substrate 31 (under the collector electrode 113). The n⁺ layer 128 begins injecting electrons when the current of the IGBT reaches a certain value, to start thyristor operation, and thus the current density can be made large.

(J) Collector Short IGBT (FIG. 32)

This IGBT is a combination of the IGBT of FIG. 25 and the IGBT of FIG. 31.

(K) MCT (FIG. 33)

In this MCT, the n⁺ layer 128 of the MCT of FIG. 26 is provided not all over but on a part of the bottom surface of the p⁻ substrate 31 (in the left half of the figure). Since the holes injected from the p diffusion region 125 can be pulled out into the p⁻ substrate 31 when the transistor turns off, by short-circuiting the p⁻ substrate 31 and the electrode 129 under the anode electrode 113, the turning off speed can be hastened.

Figure 34:
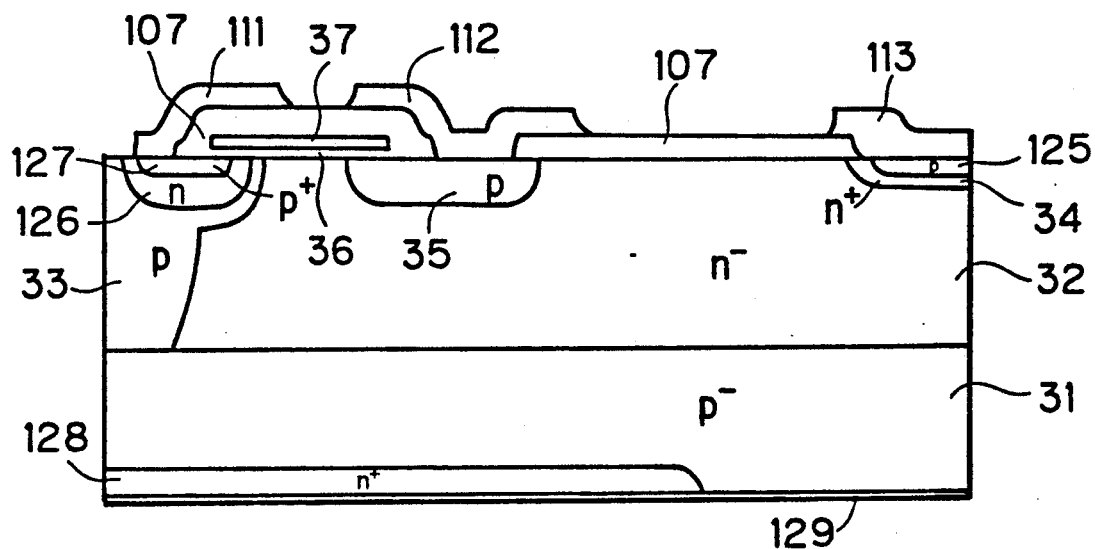

(L) Anode Short MCT (FIG. 34)

Figure 33:
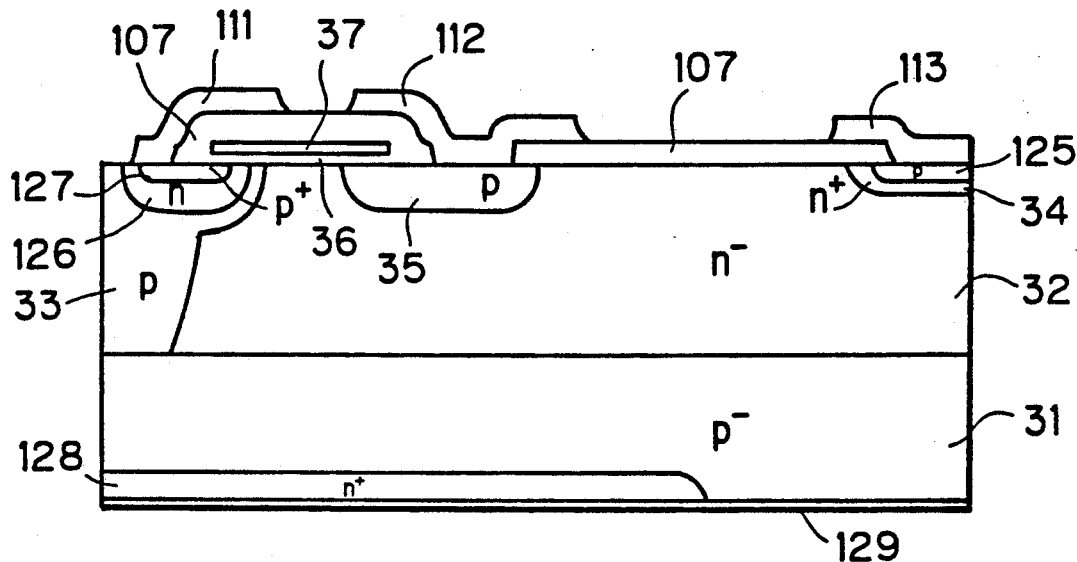

This MCT is a combination of the MCT of FIG. 27 and the MCT of FIG. 33.

(M) MCT (FIG. 35)

In this MCT, a p channel in the surface of the n diffusion region 126 just under the gate electrode 37 of the MCT of FIG. 26 is changed into a depletion type. Specifically, the surface portion of the n diffusion region 126 corresponding to the p channel is inverted into p-type by p-diffusion.

Figure 36:
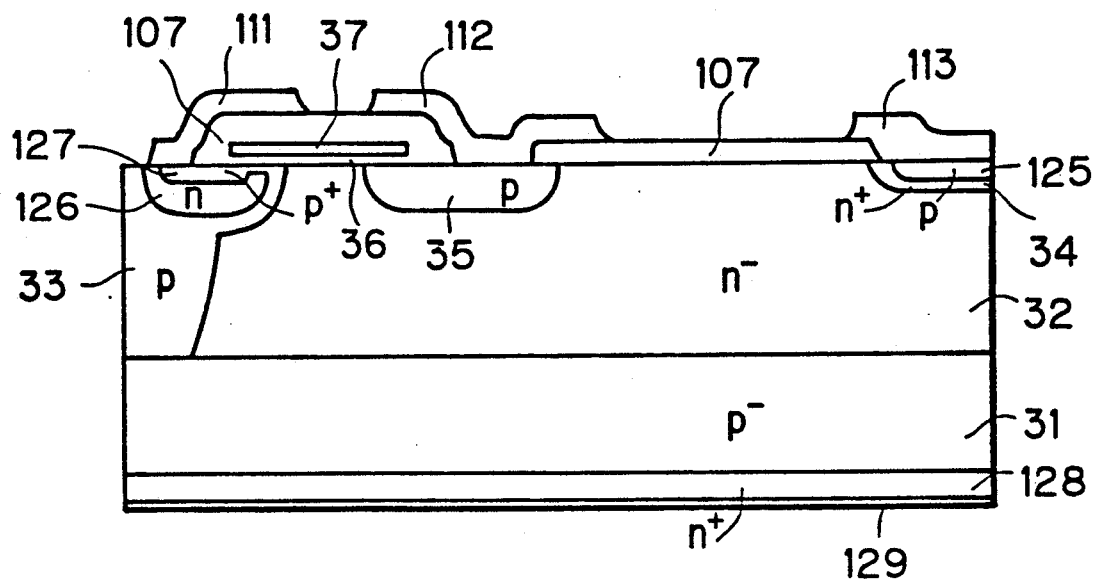
Figure 37:
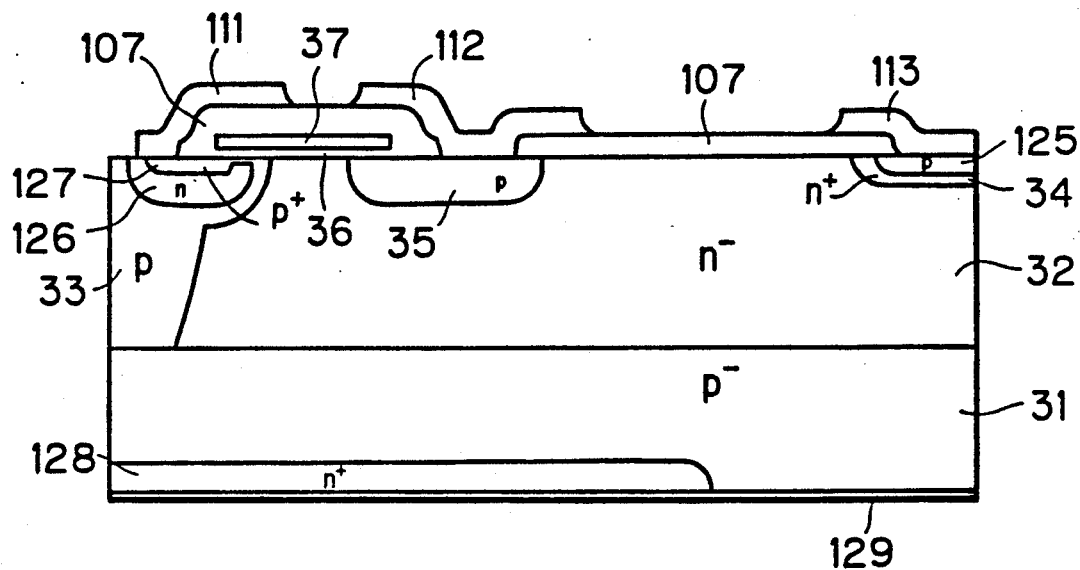

(N) Anode Short MCT (FIG. 36)

Figure 35:
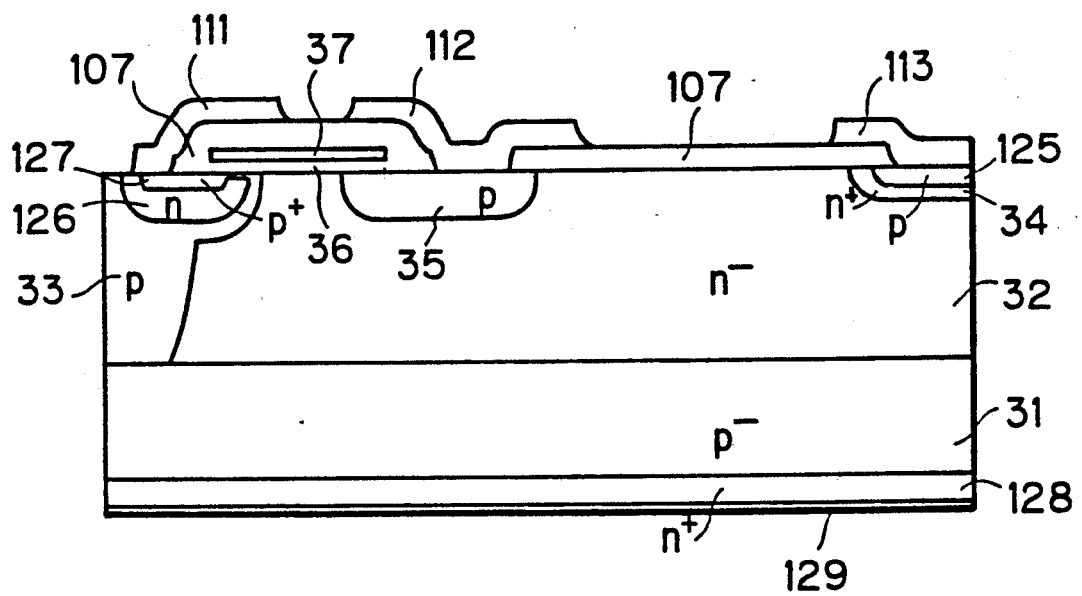

This MCT is a combination of the MCT of FIG. 27 and the MCT of FIG. 35.

(O) MCT (FIG. 37)

This MCT is a combination of the MCT of FIG. 33 and the MCT of FIG. 35.

Figure 38:
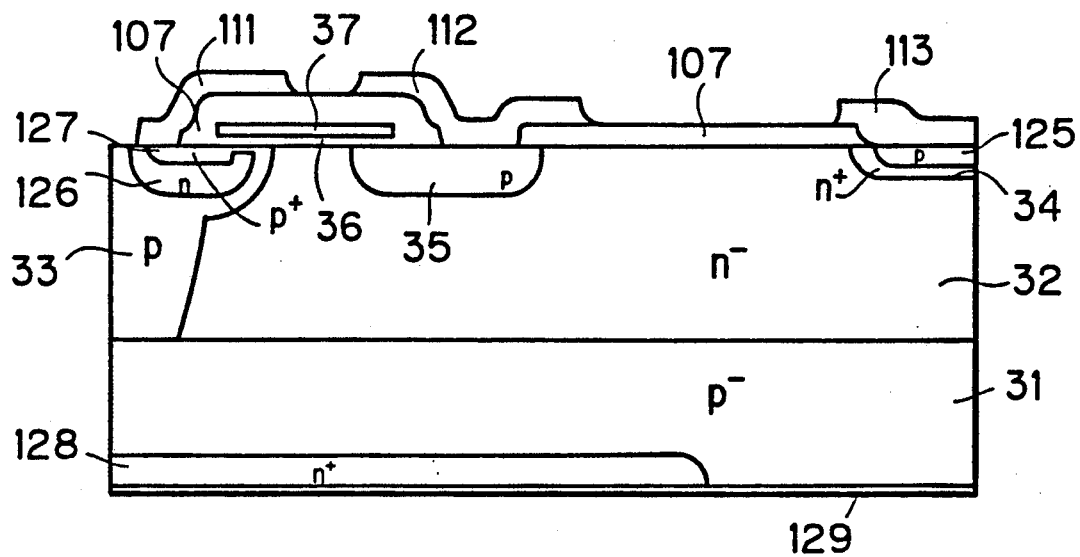

(P) Anode Short MCT (FIG. 38)

This MCT is a combination of the MCT of FIG. 28 and the MCT of FIG. 29.

Figure 1:
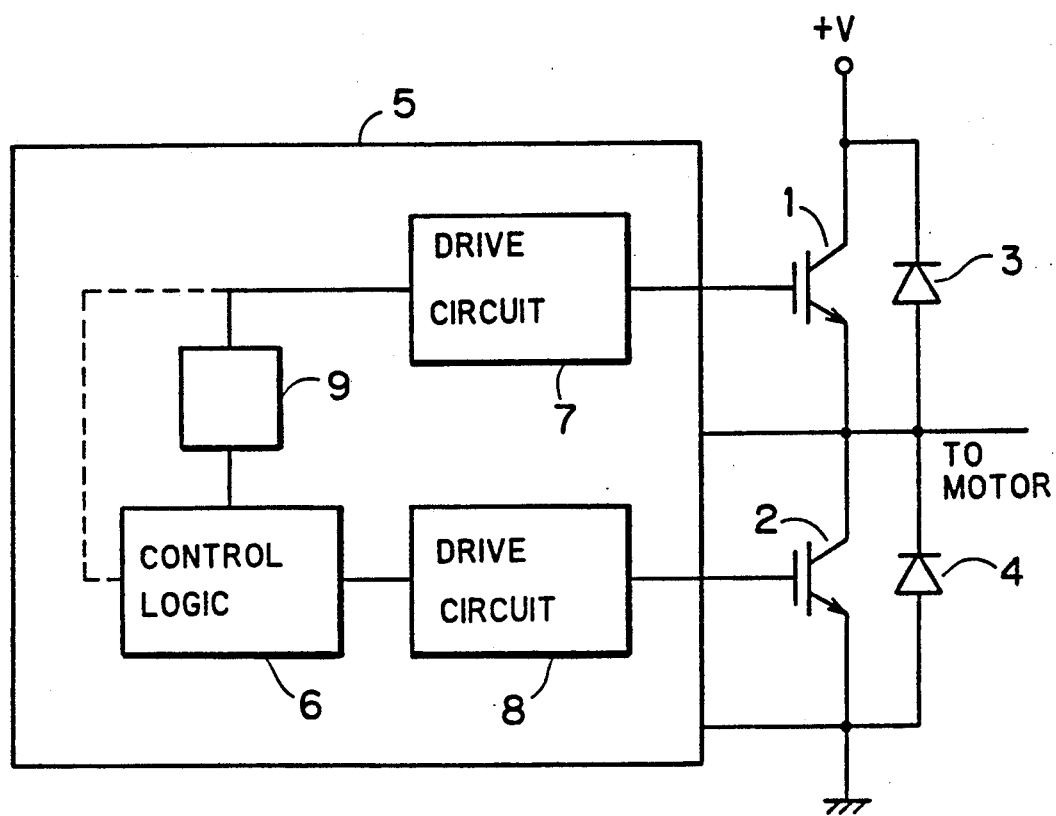
FIG. 1 is a circuit diagram showing a single phase of a conventional half bridge circuit.
Figure 2:
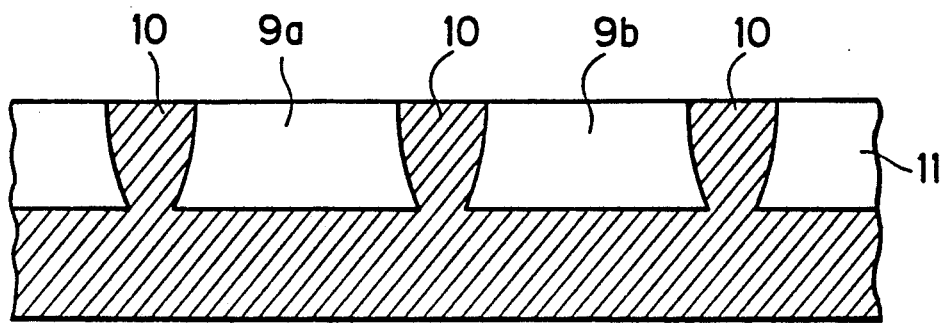
FIG. 2 is a sectional view showing isolating regions.

In the aforementioned semiconductor devices, also, because of the operations similar to those of the aforementioned diode of FIG. 1 and the MOSFET of FIG. 2, high breakdown voltage and good sense voltage characteristic can be impremented. The application of the present invention is not limited to the aforementioned semiconductor devices, as a matter of course.

Although the present invention has been described and illustrated in detail, it is clearly understood that the same is by way of illustration and example only and is not to be taken by way of limitation. The spirit and scope of the present invention should be limited only by the terms of the appended claims.

That is claimed is:

1. A semiconductor device, comprising:
   a first conductivity type semiconductor substrate;
   a second conductivity type first semiconductor region formed on said semiconductor substrate in an island manner;
   a first conductivity type second semiconductor region formed on said semiconductor substrate to surround said first semiconductor region;
   a first conductivity type third semiconductor region selectively formed in a surface of said first semiconductor region in a vicinity of said second semiconductor region;
   a voltage applying region formed in the surface of said first semiconductor region near a center thereof;
   said third semiconductor region being in a floating state so as to show a voltage in accordance with a voltage applied between said second semiconductor region and said voltage applying region in a current blocking state;
   an insulating film formed on the surface of said first semiconductor region between said second and third semiconductor regions to overlap with surfaces of said second and third semiconductor regions, wherein said insulating film has a thickness equal to or less than $nz\epsilon'2/2\epsilon$, where n denotes a ratio of an impurity concentration of said semiconductor substrate to an impurity concentration of said first semiconductor region, z denotes a thickness of said first semiconductor region, $\epsilon$ denotes a dielectric constant of a semiconductor material used for the semiconductor device and $\epsilon'$ denotes a dielectric constant of said insulating film;

a conductive film formed on said insulating film;

a sense electrode formed on said third semiconductor region for leading said voltage of said third semiconductor region outside the semiconductor device;

another insulating film opposite to said insulating film with respect to said third semiconductor region, formed on said first semiconductor region to overlap with the surface of said third semiconductor region, and wherein said another insulating film is larger in thickness than said insulating film; and another conductive film formed on said another insulating film.

2. A semiconductor device in accordance with claim 1, wherein said voltage applying region includes a second conductivity type fourth semiconductor region of an impurity concentration larger than that of said first semiconductor region.

3. A semiconductor device in accordance with claim 1, further comprising
an electrode formed on said second semiconductor region and connected with said conductive film.

4. A semiconductor device in accordance with claim 1, wherein
said sense electrode is connected with said another conductive film.

5. A semiconductor device in accordance with claim 1, further comprising
a first conductivity type another third semiconductor region selectively formed in the surface of said first semiconductor region, opposite to said third semiconductor region with respect to said another conductive film.

6. A semiconductor device in accordance with claim 5, further comprising
another sense electrode formed on said another third semiconductor region.

* * * * *